United States Patent
Kim et al.

(10) Patent No.: US 8,957,474 B2
(45) Date of Patent: Feb. 17, 2015

(54) MOS TRANSISTORS INCLUDING U SHAPED CHANNELS REGIONS WITH SEPARATED PROTRUDING PORTIONS

(71) Applicant: Samsung Electronics Co., Ltd., Suwon-si (KR)

(72) Inventors: Dae-Ik Kim, Hwaseong-si (KR); Ji-Young Kim, Yongin-si (KR); Hyeong-Sun Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/894,575

(22) Filed: May 15, 2013

(65) Prior Publication Data

US 2013/0307068 A1  Nov. 21, 2013

(30) Foreign Application Priority Data

May 16, 2012  (KR) .................. 10-2012-0052068

(51) Int. Cl.
  *H01L 29/66* (2006.01)
  *H01L 27/088* (2006.01)
  *H01L 21/8234* (2006.01)
  *H01L 27/02* (2006.01)
  *H01L 27/108* (2006.01)
  *H01L 29/423* (2006.01)

(52) U.S. Cl.
  CPC ...... *H01L 27/088* (2013.01); *H01L 21/823412* (2013.01); *H01L 21/823437* (2013.01); *H01L 21/823487* (2013.01); *H01L 27/0203* (2013.01); *H01L 27/10876* (2013.01); *H01L 27/10891* (2013.01); *H01L 29/4236* (2013.01)

USPC ....... 257/334; 257/330; 257/332; 257/E29.26

(58) Field of Classification Search
  USPC .............................. 257/334, 330, 332, E29.26
  See application file for complete search history.

(56) References Cited

U.S. PATENT DOCUMENTS

| | | | |
|---|---|---|---|
| 5,817,552 A | 10/1998 | Roesner et al. | |
| 6,037,209 A | 3/2000 | Rosner et al. | |
| 2005/0199932 A1 | 9/2005 | Abbott et al. | |
| 2008/0296671 A1 | 12/2008 | Takaishi | |
| 2010/0208860 A1 | 8/2010 | Petrovich | |
| 2011/0073925 A1 | 3/2011 | Park et al. | |
| 2011/0073939 A1 | 3/2011 | Mikasa | |
| 2011/0111568 A1 | 5/2011 | Kim et al. | |
| 2011/0143508 A1 | 6/2011 | Kim et al. | |
| 2012/0256259 A1* | 10/2012 | Surthi et al. | ..................  257/334 |

FOREIGN PATENT DOCUMENTS

JP  2011-151200  8/2011

\* cited by examiner

*Primary Examiner* — Timor Karimy
(74) *Attorney, Agent, or Firm* — Myers Bigel Sibley & Sajovec, P.A.

(57) ABSTRACT

A MOS transistor, can include a u-shaped cross-sectional channel region including spaced apart protruding portions separated by a trench and connected to one another by a connecting portion of the channel region at lower ends of the spaced apart protruding portions of the channel region. First and second impurity regions can be located at opposite ends of the -shaped cross-sectional channel region and separated from one another by the trench. A gate electrode can cover at least a planar face of the u-shaped cross-sectional channel region including the spaced apart protruding portions and the connecting portion and exposing the first and second impurity regions.

17 Claims, 37 Drawing Sheets

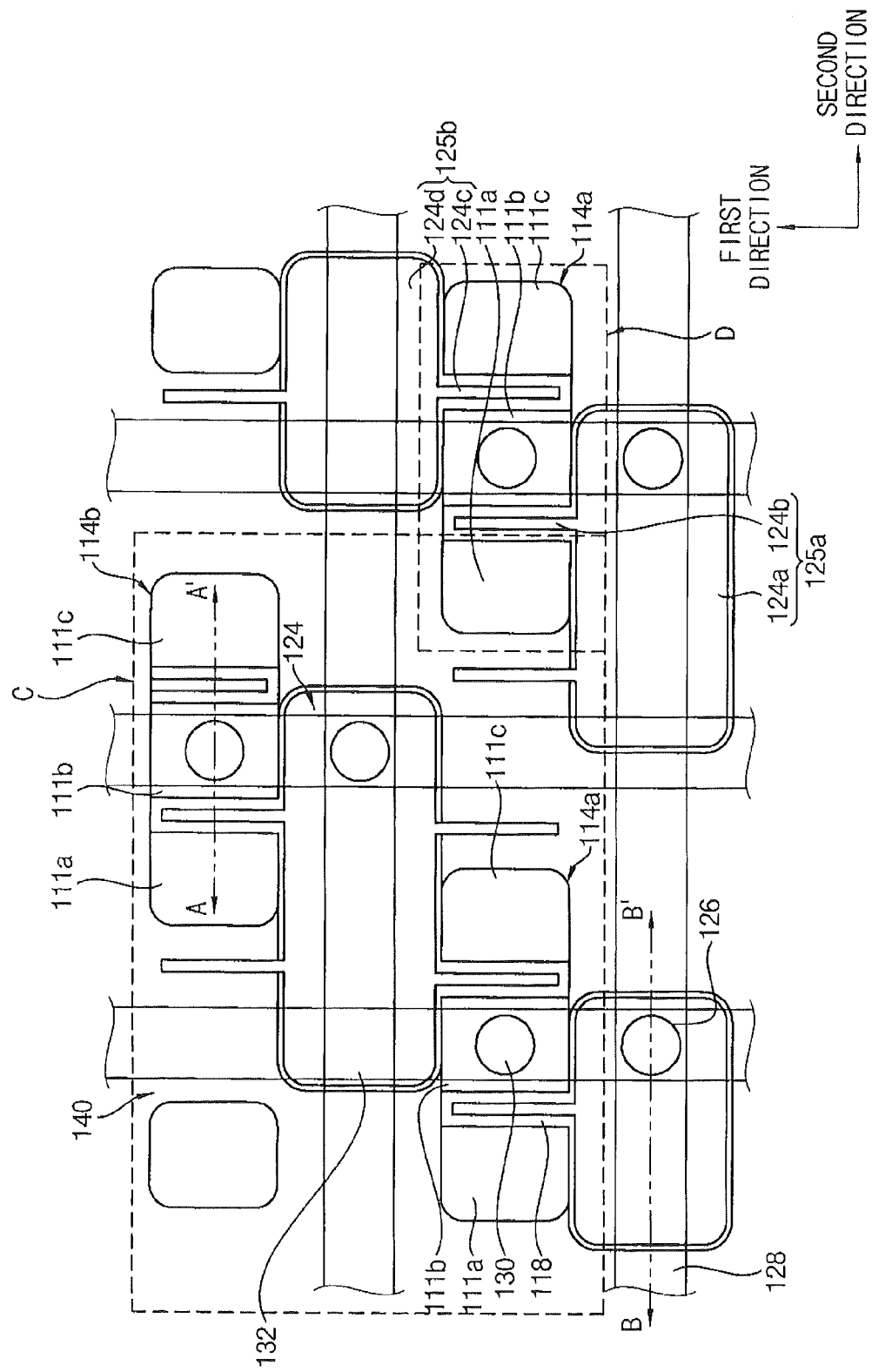

FIRST DIRECTION
SECOND DIRECTION

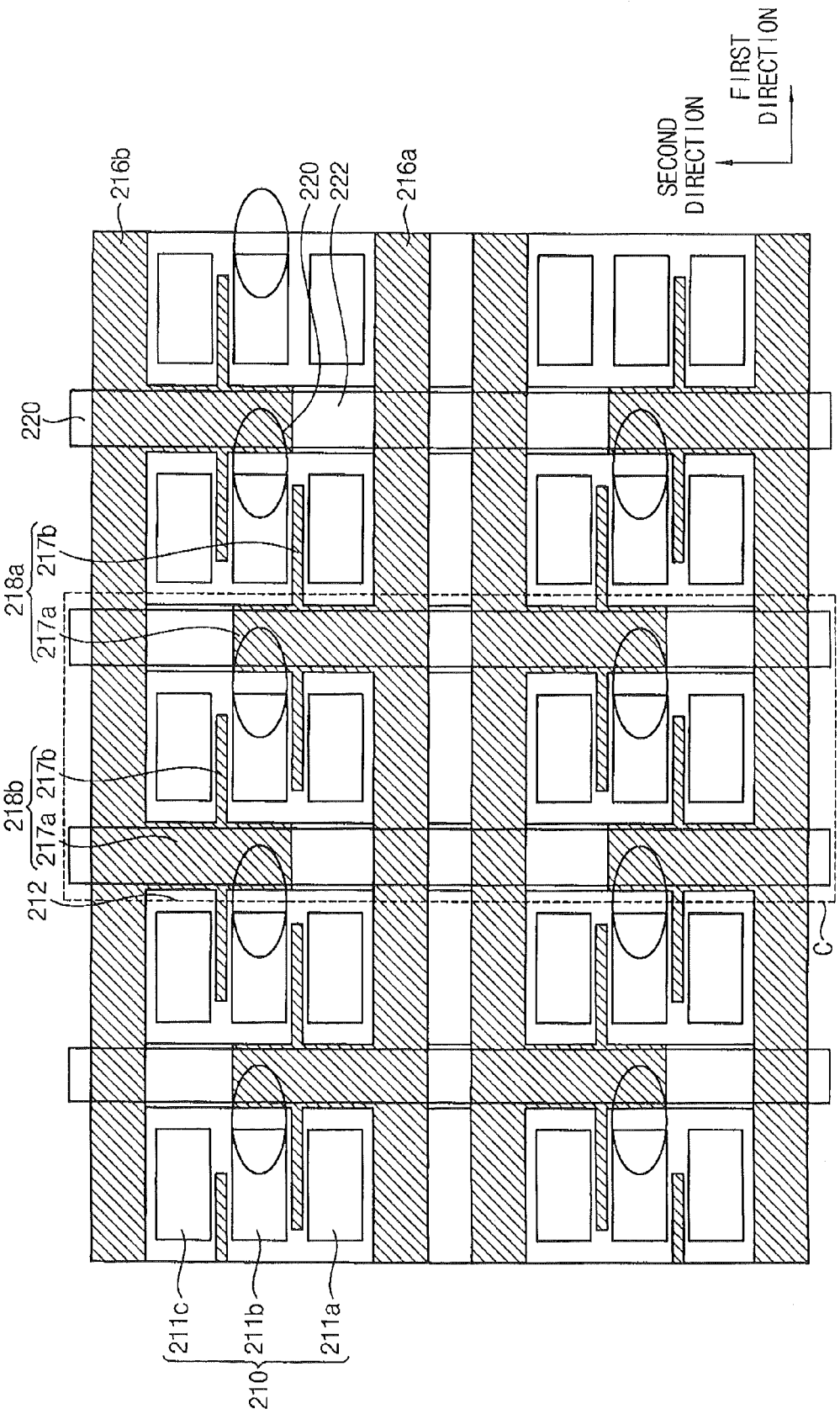

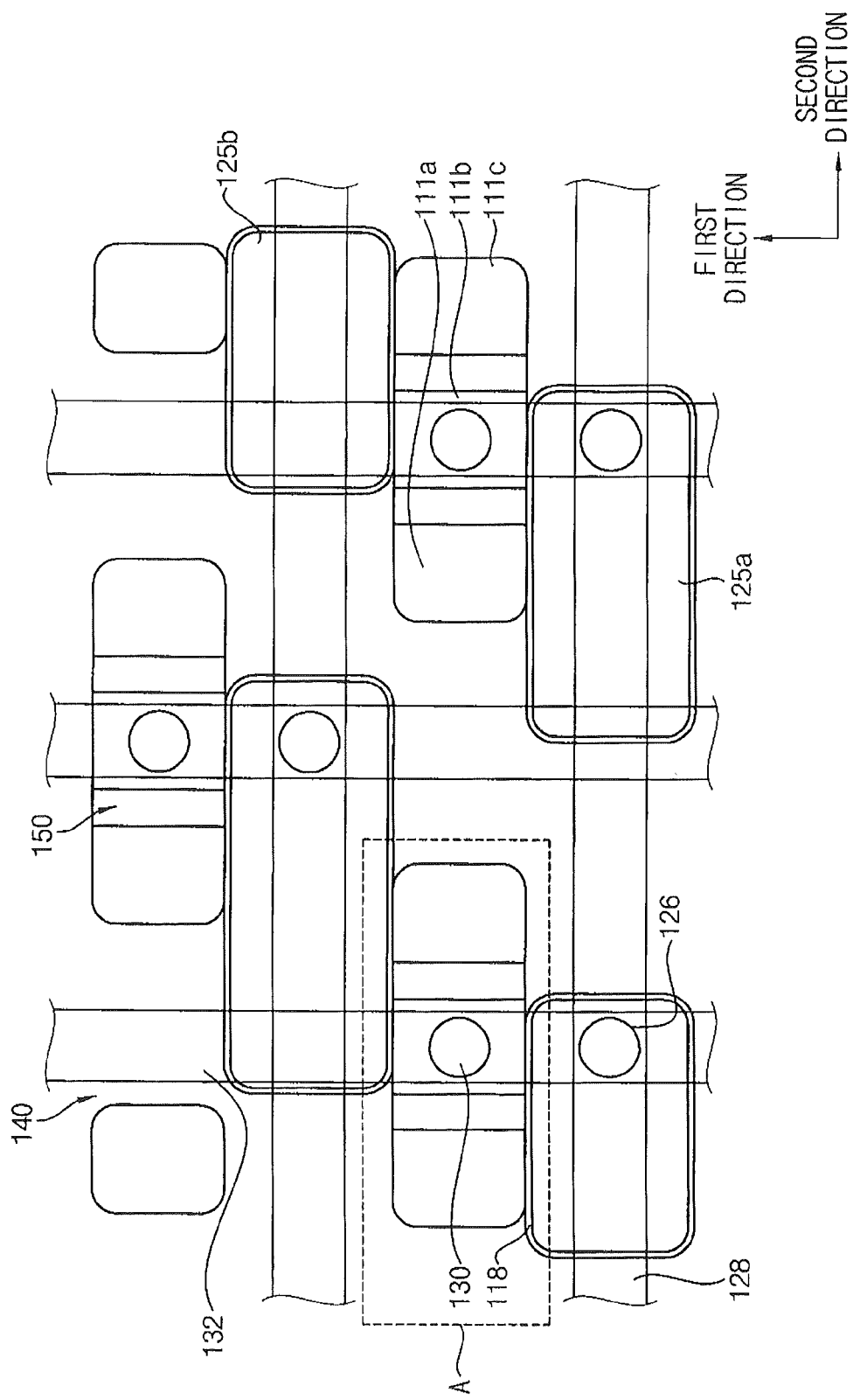

MOS TRANSISTORS INCLUDING U SHAPED CHANNELS REGIONS WITH SEPARATED PROTRUDING PORTIONS

CROSS-REFERENCE TO RELATED APPLICATION

This application claims priority under 35 USC §119 to Korean Patent Application No. 10-2012-0052068 filed on May 16, 2012 in the Korean Intellectual Property Office (KIPO), the entire disclosure of which is incorporated herein by reference.

BACKGROUND

Example embodiments relate to transistors. More particularly, to MOS transistors included in a semiconductor device.

As the size of a MOS transistor decreases, issue of punch through, short channel effects, leakage currents and GIDL, etc. may be raised. Accordingly, a MOS transistor having a high integration and a good electric characteristic may be desired.

SUMMARY

According to example embodiments, there is provided a MOS transistor. The MOS transistor includes an active pattern including a plurality of protruding patterns including a semiconductor material and arranged in parallel, and a connecting portion for forming a trench portion between the protruding patterns and connecting bottom portions of the protruding patterns with each other, and a gate insulating layer provided on a surface of the active pattern. A gate pattern is provided on the gate insulating layer and is disposed to cover a first face on the same plane of neighboring two protruding patterns and a first sidewall of the connecting portion connected to the first face. An upper surface of the gate pattern is lower than an upper surface of the protruding patterns, and a bottom surface of the gate pattern is lower than a bottom surface of a bottom surface of the trench portion between the protruding patterns. Impurity regions are provided at a portion of the protruding pattern disposed higher than the gate pattern.

In example embodiments, a channel region having a U shape may be provided along the first face of the protruding patterns covered with the gate pattern, and the first sidewall of the connecting portion.

In example embodiments, an insulating material may be buried in a trench portion between the active patterns.

In example embodiments, the gate pattern may include a first portion covering the first face of the two neighboring protruding patterns and the first sidewall of the connection portion, and a second portion making a contact with the first portion and protrude into the trench portion between the two neighboring protruding patterns.

In example embodiments, a first channel region having a U shape may be provided along the first face of the protruding patterns and the first sidewall of the connecting portion, and a second channel region having a U shape may be provided along a second face of the protruding patterns facing to each other at both sides of the trench and the upper surface of the connecting portion making a contact with the second face.

In example embodiments, the gate pattern may have an isolated pattern shape.

In example embodiments, the MOS transistor may include a word line making an electric contact with the upper surface of the gate pattern and extended in a longitudinal direction of the active pattern.

In example embodiments, the MOS transistor may include a buried word line making a direct contact with the bottom surface of the gate pattern and extended in a same direction as an extended direction of the connecting portion.

In example embodiments, an additional gate pattern may be further included to provide an additional MOS transistor. The additional gate pattern may be provided on the gate insulating layer and disposed to cover a third face on the other same plane of neighboring two protruding patterns and a second sidewall of the connecting portion connected to the third face. An upper surface of the additional gate pattern may be lower than an upper surface of the protruding patterns, and a bottom surface of the additional gate pattern may be lower than a bottom surface of a trench portion between the protruding patterns.

In example embodiments, at least one pattern among the two protruding patterns covering the additional gate pattern may be different from the protruding pattern among the two protruding patterns covering the gate pattern.

In example embodiments, three protruding patterns arranged in parallel may be included in one active pattern, and the gate pattern and the additional gate pattern may use the protruding pattern positioned at a central position of the three protruding patterns as a common active region.

In example embodiments, the impurity region provided at the protruding pattern positioned at the central position may be provided as a common impurity region of two MOS transistors.

In example embodiments, the MOS transistor may include a bit line making an electric contact with the protruding pattern provided as the common impurity region.

In example embodiments, the active pattern may be provided on a bulk silicon substrate.

In example embodiments, a plurality of MOS transistors may have an array structure including repeatedly formed unit transistors. Each of the unit transistors may include the active pattern, the gate insulating layer, the gate pattern and the impurity regions.

In some embodiments according to the inventive concept, a MOS transistor, can include a u-shaped cross-sectional channel region including spaced apart protruding portions separated by a trench and connected to one another by a connecting portion of the channel region at lower ends of the spaced apart protruding portions of the channel region. First and second impurity regions can be located at opposite ends of the -shaped cross-sectional channel region and separated from one another by the trench. A gate electrode can cover at least a planar face of the u-shaped cross-sectional channel region including the spaced apart protruding portions and the connecting portion and exposing the first and second impurity regions.

In some embodiments according to the inventive concept, A DRAM can include a common impurity region DRAM cell structure, where a first u-shaped cross-sectional channel region can include first and second spaced apart protruding portions separated by a first trench and connected to one another by a first connecting portion of the first u-shaped cross-sectional channel region at lower ends of the first and second spaced apart protruding portions.

A second u-shaped cross-sectional channel region can include the second and a third spaced apart protruding portion separated by a second trench and can be connected to one another by a second connecting portion of the second u-shaped cross-sectional channel region at lower ends of the second and third spaced apart protruding portions.

A first gate electrode can cover at least a first planar face of the first u-shaped cross-sectional channel region including the first and second spaced apart protruding portions and the first connecting portion and exposing the first and second impurity regions. A second gate electrode can cover at least a second planar face of the second u-shaped cross-sectional channel region, at an opposite end of a width of the first u-shaped cross-sectional channel region, including the second and third spaced apart protruding portions and the second connecting portion and exposing the first and second impurity regions.

BRIEF DESCRIPTION OF THE DRAWINGS

Example embodiments will be more clearly understood from the following detailed description taken in conjunction with the accompanying drawings. FIGS. 1A to 16B represent non-limiting, example embodiments as described herein.

FIG. 1A is a perspective view illustrating a MOS transistor in accordance with some embodiments of the inventive concept.

FIG. 2B is a plan view illustrating an array structure of a MOS transistor in accordance with some embodiments of the inventive concept.

FIG. 6B is a plan view illustrating an array structure of a MOS transistor in accordance with some embodiments of the inventive concept.

FIG. 8 is a perspective view illustrating an array structure in accordance with some embodiments of the inventive concept.

FIG. 9 is a perspective view illustrating a MOS transistor in accordance with some embodiments of the inventive concept.

FIG. 10B is a plan view illustrating an array structure in accordance with some embodiments of the inventive concept.

FIG. 14 is a perspective view illustrating an array structure in accordance with some embodiments of the inventive concept.

FIGS. 16A and 16B are plan views for explaining a method of manufacturing the array structure illustrated in FIGS. 15A and 15B.

DETAILED DESCRIPTION OF THE EMBODIMENTS

Figure 1A:
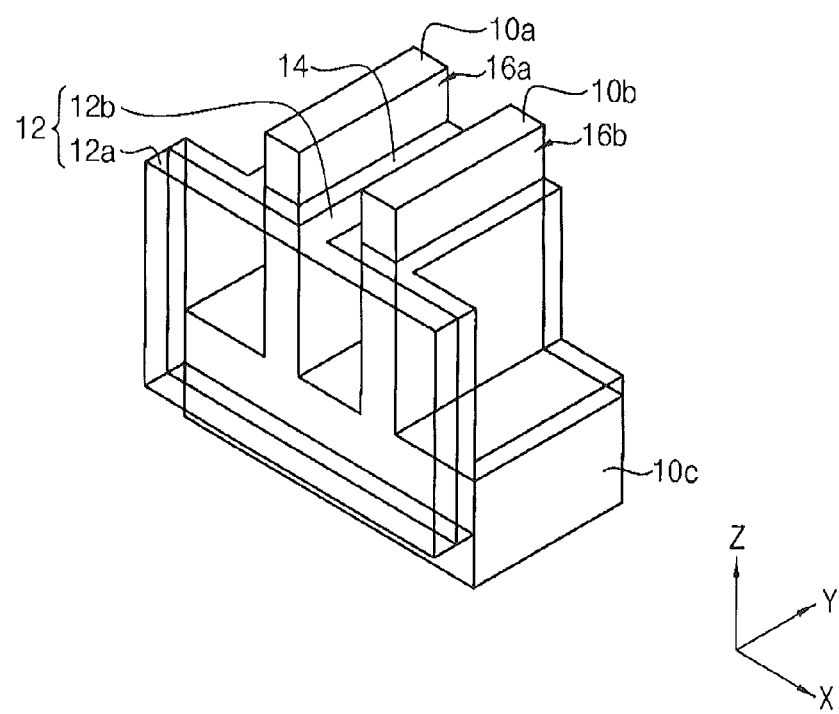

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the term "U-shaped" refers generally to the overall cross-sectional shape provided by the protruding portions and the connecting portion. It will be further understood that the term "U-shaped" is not to be construed necessarily as a literal or formal reference to an alphabetical character.

Hereinafter, example embodiments will be described in detail with reference to the accompanying drawings.

Figure 1B:
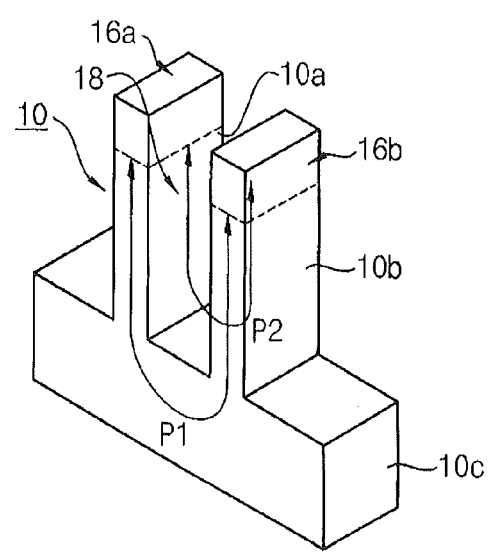
FIG. 1B is a perspective view for explaining a channel region of the MOS transistor illustrated in FIG. 1A.

FIG. 1A is a perspective view illustrating a MOS transistor in accordance with some embodiments according to the inventive concept. FIG. 1B is a perspective view for explaining a channel region of the MOS transistor illustrated in FIG. 1A.

Referring to FIGS. 1A and 1B, a MOS transistor may be formed by using a semiconductor material and include an active pattern 10 including two protruding patterns (hereinafter, will be called as first and second protruding patterns) 10a and 10b, and a connecting portion 10c for connecting the bottom portions of the protruding patterns 10a and 10b with each other. On the surface of the active pattern 10, a gate insulating layer 14 may be provided. On the gate insulating layer 14, a gate pattern 12 including a first portion 12a disposed to cover a first face, which is one face of two neighboring protruding patterns on the same plane, and a first sidewall of the connecting portion 10c connected to the first face, and a second portion 12b extended from the first portion 12a to a space between the protruding patterns 10a and 10b, may be provided. In addition, at a portion of the protruding patterns 10a and 10b disposed higher than the gate pattern 12, impurity regions 16a and 16b may be provided, respectively.

The first and second protruding patterns 10a and 10b included in the active pattern 10 may have a structure of a pillar having a substantially tetragonal cross-section and protrude in a Z-axis direction. The connecting portion with the first and second protruding patterns 10a and 10b may include single crystalline silicon. Particularly, the first and second protruding patterns 10a and 10b and the connecting portion 10c may be formed by conducting an etching process with respect to a bulk silicon substrate and in this case, may be formed in one body. The active pattern may have a U shape as illustrated in FIG. 1B (i.e., a U-shaped cross section when viewed in the Y-direction). Each of the upper portions of the first and second protruding patterns 10a and 10b included in the active pattern may be provided as the impurity regions 16a.

The gate insulating layer 14 may be disposed between the gate pattern 12 and the active pattern 10. The gate insulating layer 14 may include silicon oxide. The gate insulating layer 14 may be formed of thermal silicon oxide.

The gate pattern 12 may have an isolated island pattern shape. The first portion of the gate pattern 12 may cover the first face, which may be a face where the first and second protruding patterns 10a and 10b may not face to each other, and the second sidewall of the connecting portion connected with the first face. In addition, the second portion of the gate pattern 12 may be extended into second faces, where the first and second protruding patterns 10a and 10b at both sides of a trench portion may face each other, and the trench portion between the second faces. Accordingly, the gate pattern 12 may have a T shape when viewed from above in the Z-direction.

As illustrated in FIGS. 1A and 1B, the upper surface of the gate pattern 12 may be disposed lower than the upper surface of the first and second protruding patterns 10a and 10b. In addition, the bottom surface of the gate pattern 12 may be disposed lower than the bottom surface of the trench portion 18. In other words, the bottom surface of the gate pattern 12 may be disposed lower than the upper surface of the connecting portion 10c.

The impurity regions 16a and 16b disposed at the upper portion of the protruding patterns 10a and 10b may be provided as a source and a drain, respectively, in a MOS transistor.

As illustrated in FIG. 1B, the MOS transistor may include a three-dimensional channel region. That is, the channel region may be formed in a U shape (P1) along the first face of the first and second protruding patterns 10a and 10b and the first sidewall of the connecting portion 10c. In addition, the channel region may be formed in a U shape (P2) along the second face of the first and second protruding patterns 10a and 10b and the upper surface of the connecting portion 10c.

As described above, the length of the channel region may be increased when comparing with the physical length of the gate pattern in a horizontal direction. Accordingly, the short channel effect may be decreased. In addition, as the width (Y-direction) of the channel region may increase, an on current in the channel region may be increased and the driving capacity of the MOS transistor may be increased. A leakage current including GIDL may also be decreased.

Figure 2A:
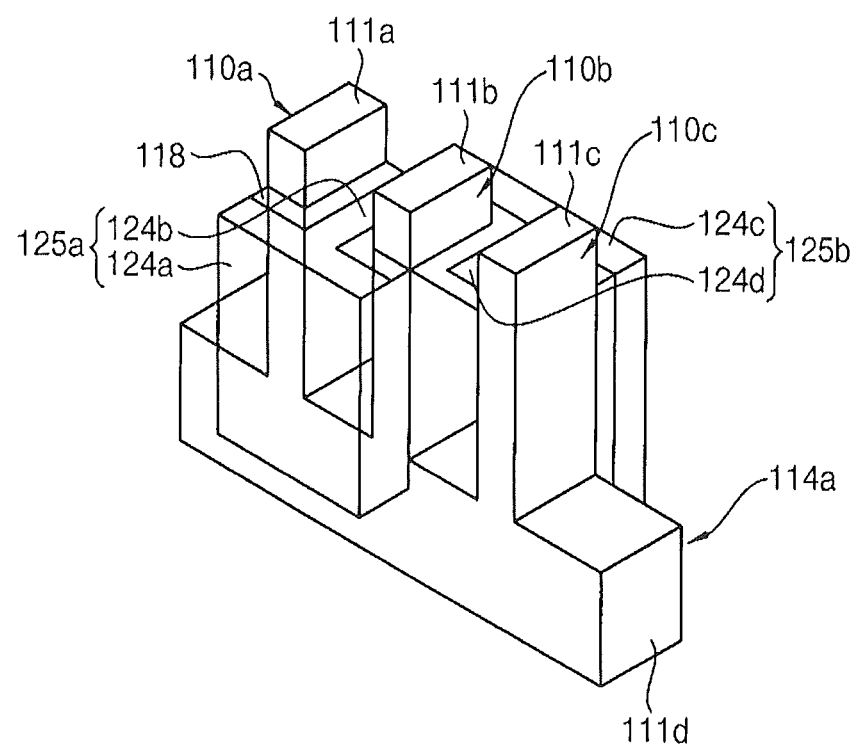
FIG. 2A is a perspective view illustrating an array structure of a MOS transistor in accordance with some embodiments of the inventive concept.
Figure 2C:
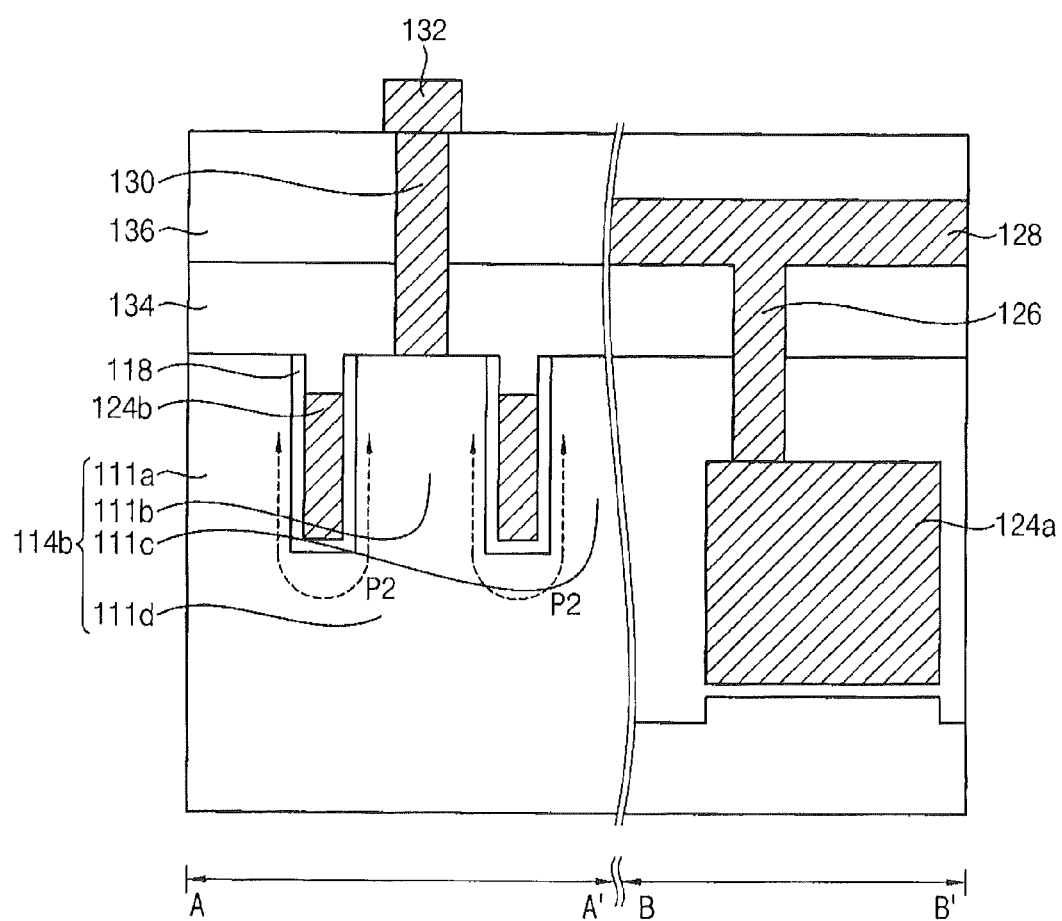
FIG. 2C is a cross-sectional view taken along a line A-A' and a line B-B' in FIG. 2B.

FIG. 2A is a perspective view illustrating an array structure of a MOS transistor in accordance with some embodiments according to the inventive concept. FIG. 2B is a plan view illustrating an array structure of a MOS transistor in accordance with some embodiments according to the inventive concept. FIG. 2C is a cross-sectional view taken along a line A-A' and a line B-B' in FIG. 2B. FIG. 2A is a perspective view on A portion in FIG. 2B.

Each of the MOS transistors in FIGS. 2A-2C may include the MOS transistor illustrated in FIGS. 1A and 1B.

One isolated active pattern may include two independent MOS transistors. One isolated gate pattern 124 may control two transistors.

Referring to FIGS. 2A to 2C, an active pattern 114 including three protruding patterns 111a, 111b and 111c, and a connecting portion 111d may be provided. The three protruding patterns 111a, 111b and 111c are arranged in parallel in a second direction. Hereinafter, the extending direction of the connecting portion of the active pattern 114 may be explained as the second direction. A vertical direction to the second direction may be explained as a first direction (or front/rear).

On the surface of the active pattern 114, a gate insulating layer 118 may be provided. On the gate insulating layer 118, gate patterns 124 may be provided. Each of the upper regions of the first to third protruding patterns 111a, 111b and 111c may become impurity regions 110a, 110b and 110c provided as source/drain of a transistor.

A word line 128 is connected with each of the gate patterns 124 and extends in the second direction. A bit line 132 is connected to the protruding pattern 111b positioned in the middle of the three protruding patterns of the active pattern 114 may be provided.

The three protruding patterns (sometimes referred to as first to third protruding patterns) 111a, 111b and 111c included in the active pattern 114 may have a structure of a pillar having a substantially tetragonal cross-section in a Z-direction. The first to third protruding patterns and the connecting portion may include a semiconductor material. The first to third protruding patterns 111a to 111c and the connecting portion 111d may include single crystalline silicon. Particularly, the protruding patterns 111a to 111c and the connecting portion 111d may be formed by etching a bulk silicon substrate. In this case, the protruding patterns 111a to 111c and the connecting portion 111d, and the substrate may be formed as one body.

The protruding pattern 111b formed at the central position of the active pattern 114 may be used as a common impurity region 110b for two independent transistors. In addition, each of the first and third protruding patterns 111a and 111c formed at both edge portions of the active pattern 114 may be used as each of the impurity regions 110a and 110c, respectively, for one transistor.

As described referring to FIG. 1A, the gate pattern 124 may include a first portion covering a first face of two protruding patterns and a first sidewall of the connecting portion connected to the first face, and a second portion extended into a trench between the two protruding patterns. In this case, one gate pattern 124 may be formed to control two transistors.

Referring to C portion in FIG. 2B, the front surface and the rear surface of the gate pattern 124 may have a shape facing different active patterns 114a and 114b, respectively.

The front surface of the gate pattern 124 may include a first portion covering a third face of the second and third protruding patterns 111b and 111c included in the first active pattern 114a, which is an active pattern disposed in front of the gate pattern 124, and a second sidewall portion of the connecting portion 111d, and a second portion extended to the trench portion between the second and third protruding patterns 111b and 111c.

Similarly, the rear surface of the gate pattern 124 may include a first portion covering a first face of the first and the second patterns 111a and 111b included in the second active pattern 114b, which is an active pattern disposed at the rear of the gate pattern 124, and a second sidewall portion of the connecting portion 111d, and a second portion extended to the trench portion between the second and third protruding patterns 111b and 111c.

As illustrated in FIG. 2B, one gate pattern 124 may be used as a common gate electrode with respect to one MOS transistor formed at the first active pattern and one MOS transistor formed at the second active pattern.

Hereinafter, the gate pattern is described on one active pattern referring to D portion in FIGS. 2A and 2B.

Gate patterns 125a and 125b facing the front surface and the rear surface of one of the first active pattern 114a may be respectively provided. Hereinafter, the front surface of the first active pattern will be referred to as the first face, and the rear surface of the first active pattern will be referred to as the third face. In addition, the gate pattern facing the first face will be referred to as the first gate pattern 125a and the gate pattern facing the third face will be referred to as the second gate pattern 125b.

The first gate pattern 125a may face the first and second protruding patterns 111a and 111b, and the second gate pattern 125b may face the second and third protruding patterns 111b and 111c.

In the first active pattern 114a, the upper portions of the first and second protruding patterns 111a and 111b positioned higher than the upper surface of the first gate pattern 125a may become impurity regions 110a and 110b of a first transistor, respectively. Accordingly, the upper surface of the first gate pattern 125a may be positioned lower than the upper surface of the first and second protruding patterns 111a and 111b. In addition, since the first gate pattern 125a covers at least a portion of the sidewall of the connecting portion 111d, the bottom surface of the first gate pattern 125a may be lower than the bottom surface of the trench.

Similarly, in the first active pattern 114a, the upper portions of the second and third protruding patterns 111b and 111c positioned higher than the upper surface of the second gate pattern 125b may become impurity regions 110b and 110c of a second transistor, respectively. Accordingly, the upper surface of the second gate pattern 125b may be positioned lower than the upper surface of the second and third protruding patterns 111b and 111c. In addition, since the second gate pattern 125b covers at least a portion of the sidewall of the connecting portion 111d, the bottom surface of the second gate pattern 125b may be lower than the bottom surface of the trench.

The first and second gate patterns 125a and 125b may be arranged in nonparallel but may have a staggered arrangement to each other in the first direction.

In the first gate pattern 125a, the end portion of the second portion extended between the first and second protruding patterns 111a and 111b may not extend to the end portion of the first and second protruding patterns 111a and 111b. That is, an insulating material may be formed between the end portions of the first and second protruding patterns 111a and 111b. In addition, the second gate pattern 125b and the first gate pattern 125a may also have the same shape.

As described above, two independent MOS transistors may be provided to each one of the active patterns 114a and 114b. The two independent MOS transistors may each include one U shape channel along the first face of the protruding pattern and the connecting portion, and one U shape channel along the trench portion between the protruding patterns. Each of the MOS transistors may include the same channel as illustrated in FIG. 1A.

Between the isolated active patterns, and between the gate patterns 124, an insulating pattern 140 for device isolation may be provided.

A bit line 132 may be extended in the first direction vertical to the longitudinal direction of the active pattern 114. The bit line 132 may make an electric connection with the upper surface of the second protruding pattern 111b positioned at the central position of the active pattern 114 through a bit line contact 130. That is, the bit line 132 may make an electric connection with the common impurity region 110b.

A word line 128 may be extended in the second direction. The word line 128 may be extended in the longitudinal direction of the active patterns 114a and 114b. The word line 128 may make an electric connection with the upper surface of the gate pattern 124 disposed in the second direction through a word line contact 126. That is, the word line 128 and the gate pattern 124 may not be formed in one body, but the word line 128 and the gate pattern 124 may be separately provided.

Particularly, the word line contact 126 and the bit line contact 130 may be disposed in parallel in the first direction. When the word line contact 126 is disposed as described above, the GIDL generated at the upper portion of the first and third protruding patterns 111a and 111c may be decreased. However, the position of the word line contact 126 may not be limited, except that the word line contact 126 should make contact with the upper surface of the gate pattern 124.

The array structure may be an array structure for a DRAM device. That is, when capacitors are provided in electric contact with the upper surface of the first and third protruding patterns 111a and 111c of the array structure a DRAM device may be obtained.

FIGS. 3A to 3H are plan views for explaining a method of manufacturing an array structure illustrated in FIG. 2B.

Figure 3A:
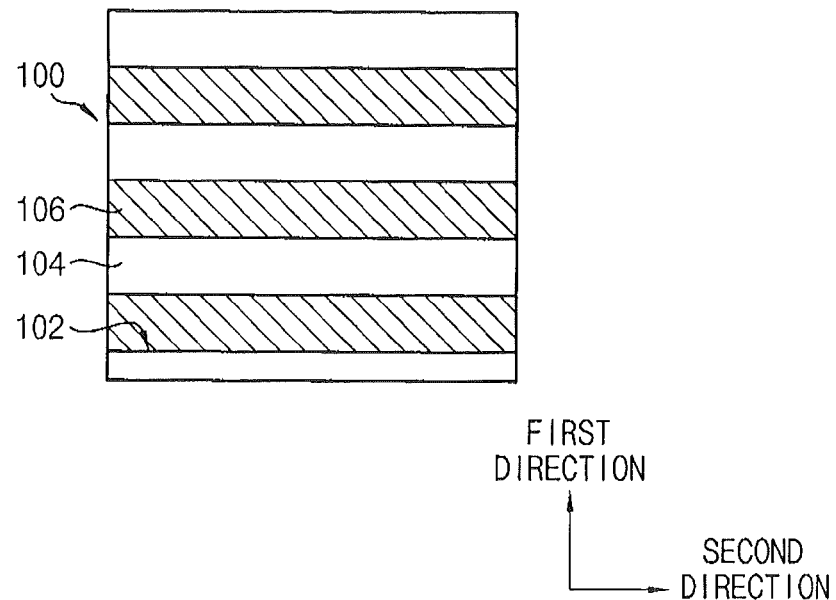
FIGS. 3A to 3H are plan views for explaining a method of manufacturing an array structure illustrated in FIG. 2B.

Referring to FIG. 3A, a hard mask extended in a second direction may be formed on a semiconductor substrate 100 and a first trench 102 may be formed by conducting a dry etching using the hard mask as an etching mask. At both sides of the first trench 102, preliminary active patterns 104 may be formed. The semiconductor substrate 100 may be a single crystalline silicon substrate. The first trench 102 may have a first depth.

The inner portion of the first trench 102 between the preliminary active patterns 104 may be filled up with a preliminary first insulating layer 106. The preliminary first insulating layer 106 may be formed by using silicon oxide or silicon nitride.

Figure 3B:
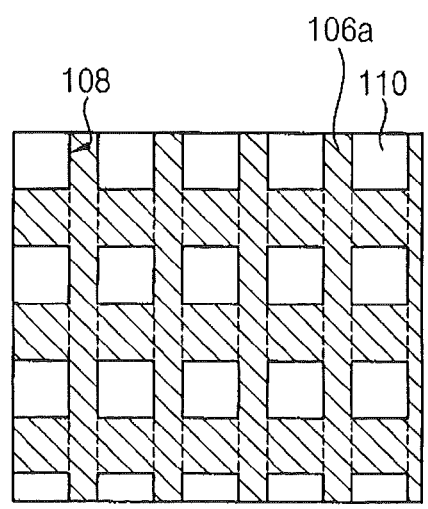

Referring to FIG. 3B, a portion of the preliminary active pattern 104 and the preliminary first insulating layer 106 may be etched to form a second trench 108 extended in the first direction perpendicular to the second direction. The second trench 108 may be formed to have a second depth smaller than the first depth. Through forming the second trench 108, isolated preliminary protruding patterns 110 may be formed. The preliminary protruding patterns 110 may not make a staggered arrangement but may be arranged in an X-direction and a Y-direction.

The inner portion of the second trench 108 between the preliminary protruding patterns 110 may be filled up with the same insulating material as the preliminary first insulating layer 106. Accordingly, a first insulating layer 106a may be formed.

Figure 3C:
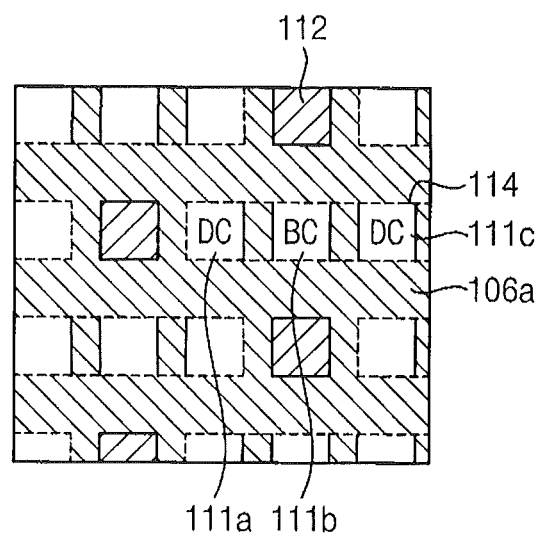

Referring to FIG. 3C, an etching mask pattern for exposing the preliminary protruding pattern 110 and a portion of the first insulating layer 106a may be formed. The etching mask pattern may have a shape of exposing a portion to be removed from the preliminary protruding pattern 110. The portion of the preliminary protruding pattern 110 may be etched by using the etching mask pattern to form protruding patterns 111a, 111b and 111c.

The inner portion of an opening portion formed through etching the preliminary protruding pattern 110 may be filled up with a second insulating layer 112 having an etching selectivity with respect to the first insulating layer 106a. When the first insulating layer 106a is formed by using silicon oxide, the second insulating layer 112 may be formed by using silicon nitride. The second insulating layer 112 may have the same pillar shape as the protruding patterns 111a, 111b and 111c.

Through conducting the above-described procedure, an active pattern 114 including three protruding patterns 111a, 111b and 111c and underlying connecting portion may be formed, as illustrated in FIG. 2A. That is, the active patterns 114 may include the first to third protruding patterns 111a, 111b and 111c. The space between the active patterns 114 may be filled up with an insulating material. The active patterns 114 formed in an odd row and an even row may have a staggered arrangement.

For a DRAM device, the upper surface of the first and third protruding patterns 111a and 111c may become a buried contact (BC) region for making an electric contact with a capacitor in the active pattern. In addition, the upper surface of the second protruding pattern 111b in the active pattern may become a direct contact (DC) region for making an electric contact with a bit line.

Figure 3D:
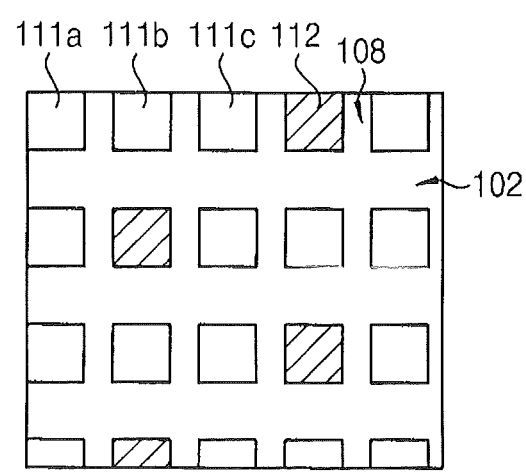

Referring to FIG. 3D, the first insulating layer 106a may be removed to expose the first and second trenches 102 and 108 using a wet etching process. After conducting the removal process, the sidewall of the protruding patterns 111a, 111b and 111c may be exposed. In addition, the second insulating layer 112 may not be removed but remain after the removal process is complete.

Figure 3E:
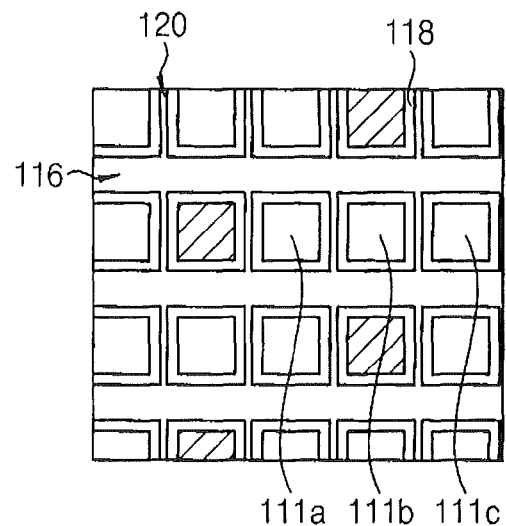

Referring to FIG. 3E, a gate insulating layer 118 may be formed at the outer wall of the protruding patterns 111a, 111b and 111c. The gate insulating layer 118 may be formed by a thermal oxidation process or a chemical vapor deposition method. The gate insulating layer 118 may be formed by using silicon oxide.

The gate insulating layer 118 may not fill up the inner portion of the first and second trenches 102 and 108 but may be conformally formed along the sidewall and the bottom surface of the first and second trenches 102 and 108. Accordingly, third and fourth trenches 116 and 120 having a cross shape may be formed.

Figure 3F:
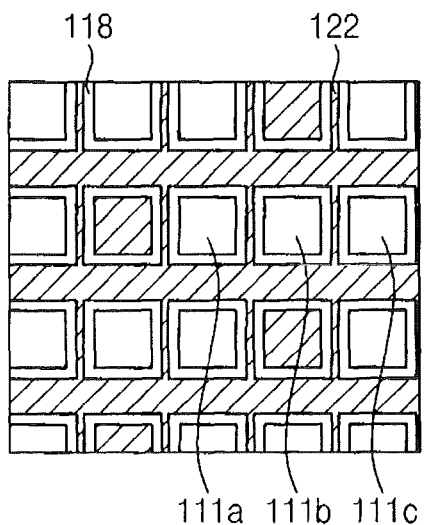

Referring to FIG. 3F, a gate electrode layer filling up the inner portion of the third and fourth trenches 116 and 120 may be formed on the gate insulating layer 118. The gate electrode layer may be formed by using polysilicon.

Then, the gate electrode layer may be planarized to expose the upper surface of the protruding patterns 111a, 111b and 111c. The gate electrode layer may be additionally removed so that the upper surface of the gate electrode layer may be lower than the upper surface of the protruding patterns 111a, 111b and 111c. Through conducting the process, a preliminary gate pattern 122 having a cross shape may be formed.

Figure 3G:
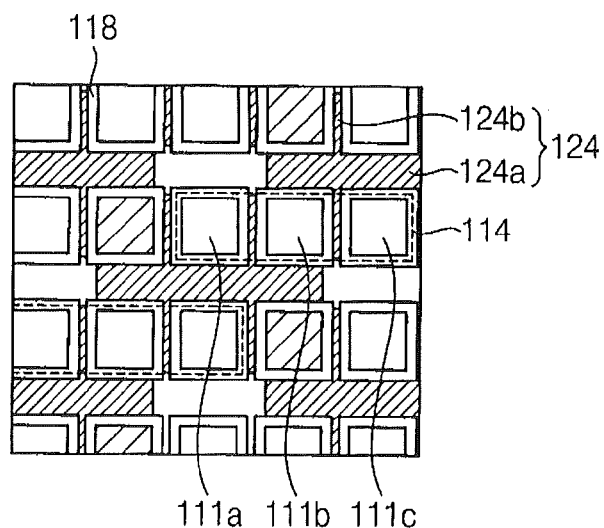

Referring to FIG. 3G, an etching mask pattern exposing a portion of the preliminary gate pattern 122 may be formed. The etching mask pattern may have a shape of exposing a portion to be removed from the preliminary gate pattern 122 for separating the preliminary gate pattern 122 and forming independent gate patterns. A portion of the preliminary gate pattern may be etched by using the etching mask pattern to form a gate pattern 124. The gate pattern may have portions that are isolated from one another.

As illustrated in FIG. 3G, the gate pattern 124 may include a first portion 124a extended in parallel with the longitudinal direction of the active pattern 114, and a second portion 124b protrude from the first portion 124a to a trench portion between the protruding patterns 111a, 111b and 111c.

In addition, one gate pattern 124 may be provided as a common gate pattern with respect to each of the active pattern 114 provided at the front surface of the gate pattern 124 and the rear surface of the gate pattern 124. That is, one gate pattern 124 may be used as a gate electrode of two transistors. Accordingly, the second portion 124b in one gate pattern 124 may have a shape extended to the trench portion between the protruding patterns 111a, 111b and 111c included in the two active patterns 114.

Figure 3H:
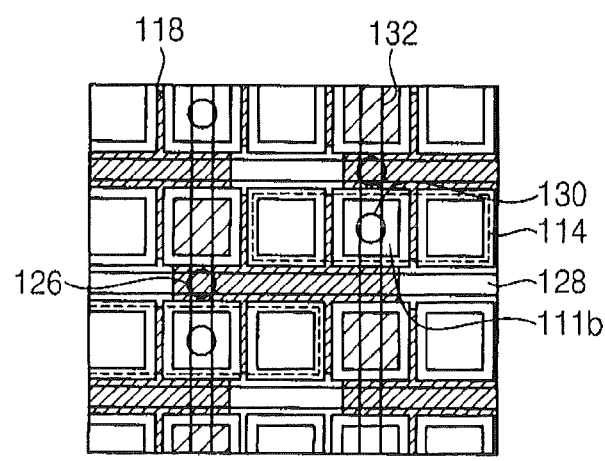

Referring to FIG. 3H, an insulating interlayer 134 (see FIG. 2C) for filling up a gap between the gate patterns 124 and covering the gate patterns 124 and the active patterns 114 may be formed. A portion of the insulating interlayer may be etched to from a contact hole exposing the upper surface of the gate pattern 124. A word line contact 126 may be formed in the contact hole. In addition, a word line 128 making contact with the word line contact 126 and extended in the second direction may be formed. The word line 128 may be disposed between the active patterns 114 and extended in the second direction. The word line 128 may include a metal material. For example, the word line 128 may be formed by depositing tungsten.

A second insulating interlayer 136 (see FIG. 2C) covering the word line 128 may be formed. A portion of the second insulating interlayer 136 may be etched to form a contact hole exposing the upper surface of the second protruding pattern 111b (DC) disposed at the central position of the active pattern 114. In the contact hole, a bit line contact 130 may be formed. In addition, a bit line 132 making a contact with the bit line contact 130 and extended in the first direction may be formed.

Figure 4A:
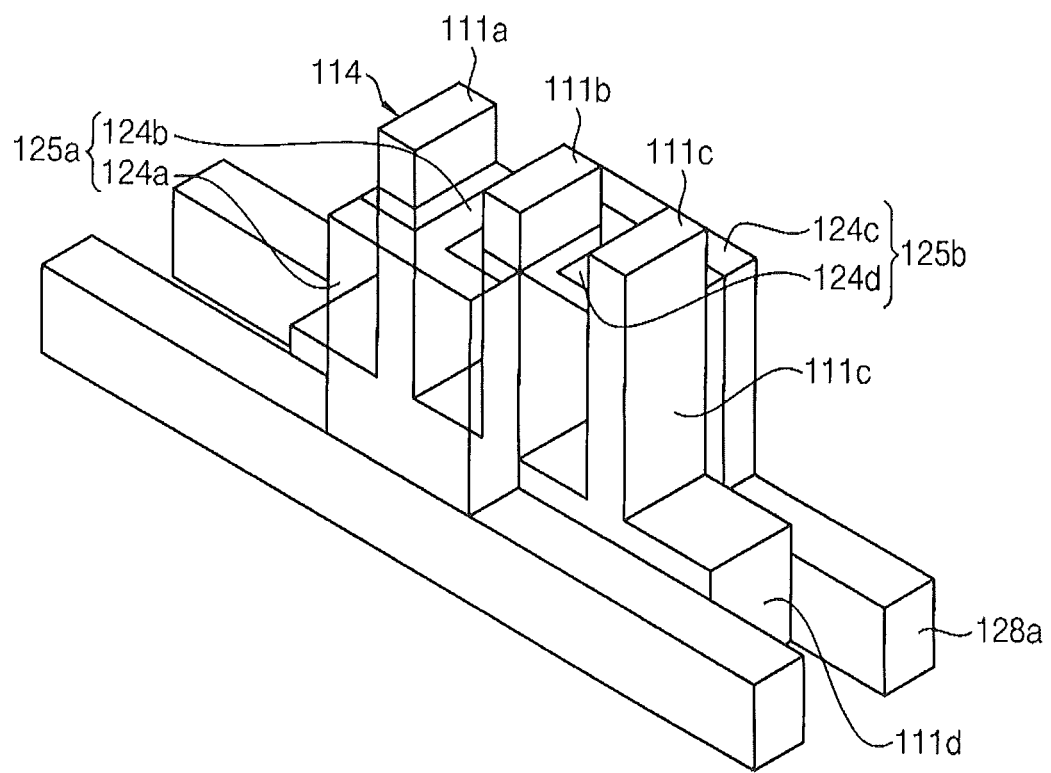
FIG. 4A is a perspective view illustrating an array structure in accordance with some embodiments of the inventive concept.
Figure 4B:
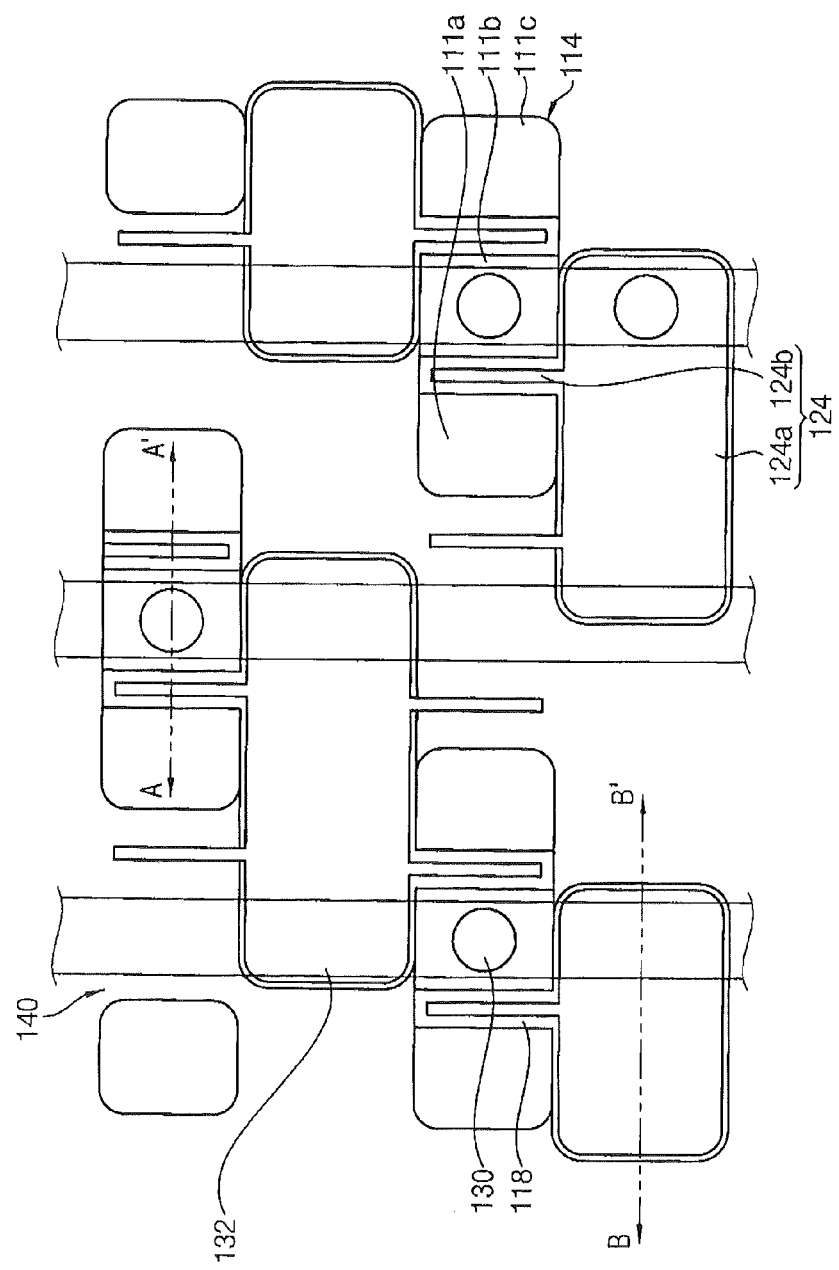
FIG. 4B is a plan view illustrating an array structure in accordance with some embodiments of the inventive concept.
Figure 4C:
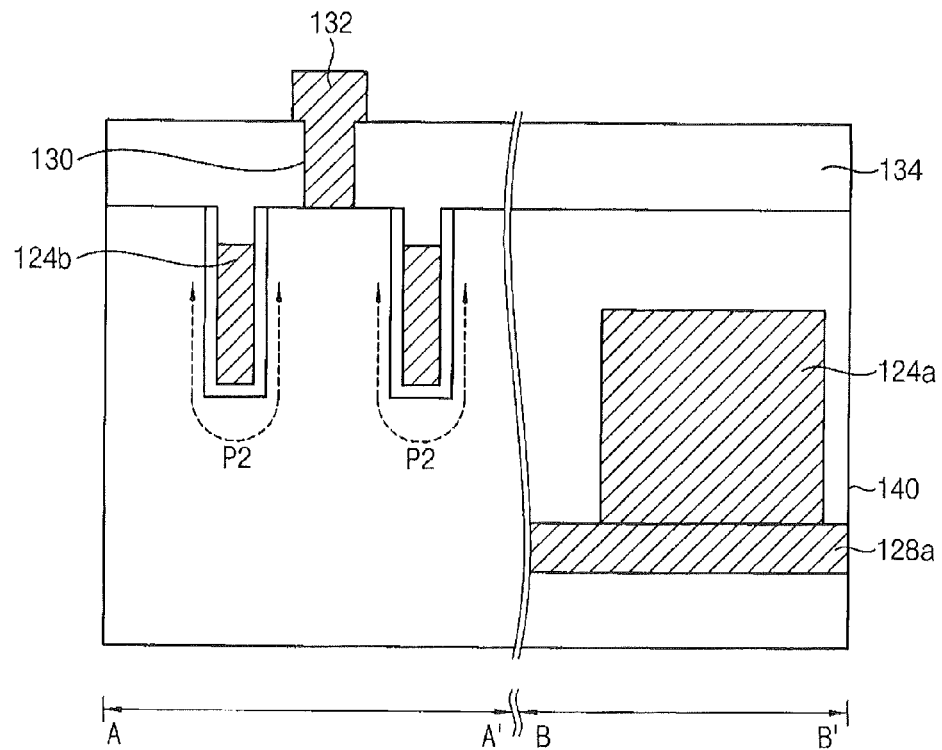
FIG. 4C is a cross-sectional view taken along a line A-A' and B-B' in FIG. 4B.

FIG. 4A is a perspective view illustrating an array structure in accordance with some embodiments according to the inventive concept. FIG. 4B is a plan view illustrating an array structure in accordance with some embodiments according to the inventive concept. FIG. 4C is a cross-sectional view taken along a line A-A' and B-B' in FIG. 4B.

A transistor included in the array structure illustrated in FIGS. 4A to 4C may be the same as the MOS transistor illustrated in FIGS. 2A and 2B.

Referring to FIGS. 4A to 4C, a word line 128a may have a buried word line structure making a contact with the bottom portion of a gate pattern 124, different from FIGS. 2A and 2B. Since the word line 128a may make a direct contact with the bottom surface of the gate pattern 124, a separate word line contact may not be provided. The remaining elements are the same as described in FIGS. 2A and 2B.

The word line 128a may be separated from the sidewall of the connecting portion 111d of the active pattern. That is, an insulating material may be provided between the connecting portion 111d of the active pattern and the word line.

Hereinafter, a method of manufacturing the array structure illustrated in FIGS. 4A to 4C will be explained.

Figure 5A:
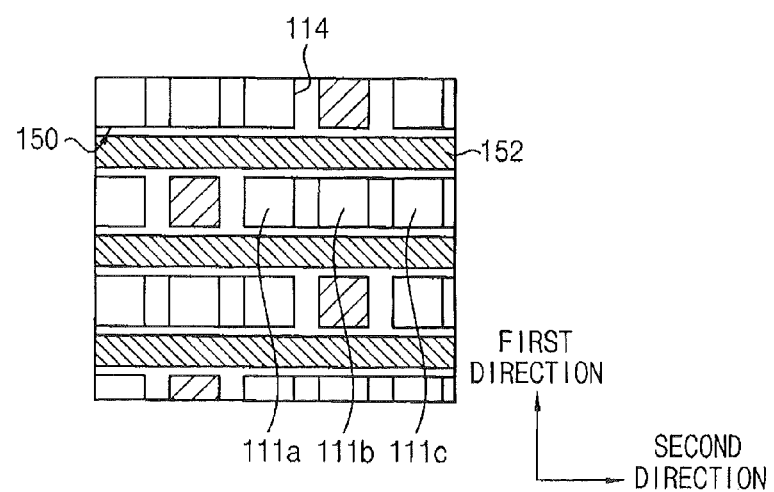
FIGS. 5A to 5C are plan views for explaining a method of manufacturing the structure illustrated in FIG. 4A.
Figure 5B:
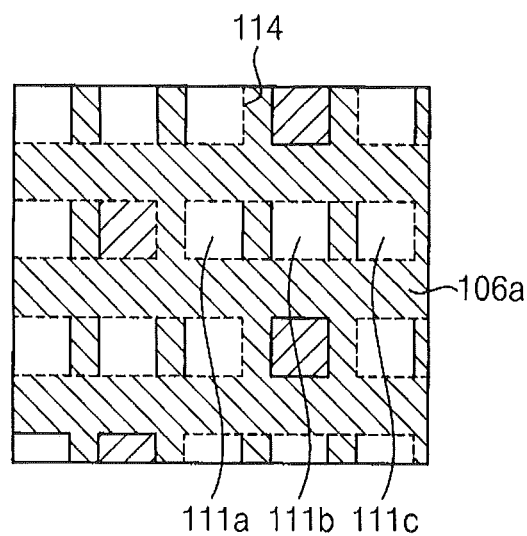
Figure 5C:
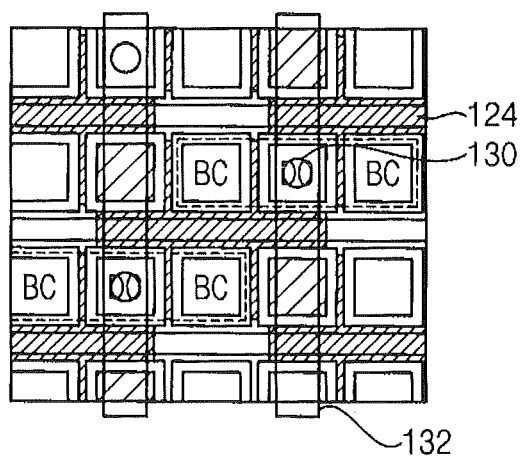

FIGS. 5A to 5C are plan views for explaining a method of manufacturing the structure illustrated in FIG. 4A.

The same procedure explained referring to FIGS. 3A to 3C may be conducted to manufacture the structure illustrated in FIG. 3C.

Referring to FIG. 5A, the insulating material disposed between the protruding patterns 111a, 111b and 111c may be etched to form a third trench 150 extended in the second direction. The third trench 150 may become a portion for forming a buried word line.

In this case, the active pattern 114 is unexposed to the sidewall of the third trench 150. That is, the insulating material may remain on the sidewall of the active pattern 114. After forming the third trench 150, a deposition process of an insulating material on the sidewall of the third trench 150 may be additionally conducted. The third trench 150 may be formed to have a depth greater than that of the first and second trenches.

A buried word line pattern 152 may be formed in the third trench 150. The upper surface of the buried word line pattern 152 may be positioned lower than the bottom surface of the second trench. Particularly, the buried word line pattern 152 may be formed by depositing a conductive material in the third trench 150 and then conducting an etch back process with respect to the conductive material.

Referring to FIG. 5B, the inner portion of the third trench 150 including the buried word line pattern 152 formed at the lower portion thereof, may be filled up with an insulating material. The insulating material may be the same material 106a as the first insulating material. Through conducting the above-described processes, a structure may be formed to have a lower portion including the buried word line pattern 152 and an upper portion having the same shape as illustrated in FIG. 3C.

Then, the first insulating layer and the insulating material may be removed to form first and second trenches as explained referring to FIG. 3D. In this case, the buried word line pattern 152 may be exposed at the bottom surface of the second trench. The same procedure may be conducted as explained referring to FIGS. 3E to 3G to form a gate pattern 124. The bottom surface of the gate pattern 124 may be formed to make a contact with the buried word line pattern 152.

Referring to FIG. 5C, a first insulating interlayer 134 (see FIG. 4C) filling up a gap between the gate patterns 124 while covering the gate pattern 124 and the active pattern 114 may be formed.

A portion of the first insulating interlayer 134 may be etched to form a contact hole exposing the upper surface of the second protruding pattern 111b positioned at the center of the active pattern 114. A bit line contact 130 may be formed in the contact hole. In addition, a bit line 132 making a contact with the bit line contact 130 and extended in the first direction may be formed.

Figure 6A:
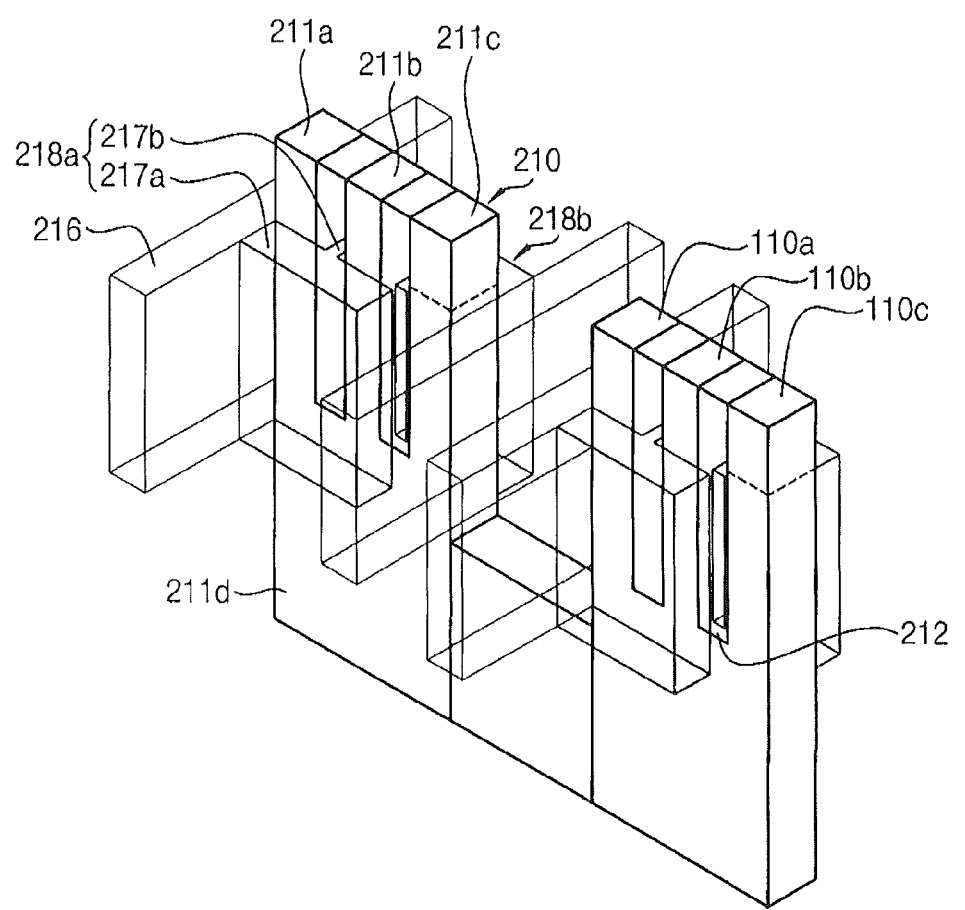
FIG. 6A is a perspective view illustrating an array structure of a MOS transistor in accordance with some embodiments of the inventive concept.

FIG. 6A is a perspective view illustrating an array structure of a MOS transistor in accordance with some embodiments according to the inventive concept. FIG. 6B is a plan view illustrating an array structure of a MOS transistor in accordance with some embodiments according to the inventive concept.

FIG. 6A corresponds to C portion in FIG. 6B, and a bit line portion is omitted in FIG. 6A. Each of the MOS transistors included in the array structure in this embodiment may include the MOS transistor illustrated in FIG. 1.

Referring to FIGS. 6A and 6B, an active pattern 210 including three protruding patterns (hereinafter, will be referred to as first to third protruding patterns) 211a, 211b and 211c and a connecting portion 211d, a first gate pattern 218a having an isolated shape and disposed at one face of two protruding patterns among the three protruding patterns and at the sidewall of the connecting portion, and a second gate pattern 218b having an isolated shape and disposed at the other one face of the two protruding patterns among the three protruding patterns and at the other sidewall of the connection portion, may be included on a semiconductor substrate 100.

A gate insulating layer 212 may be disposed between the active pattern 210 and the first and second gate patterns 218a and 218b.

A bit line 222 connected to the second protruding pattern 211b positioned at the central position of the active pattern 210 may be formed. Word lines 216a and 216b, respectively connected to each of the isolated gate patterns 218a and 218b may be provided.

In this example embodiment, two independent transistors may be provided to one of the active patterns 210 having an isolated shape. In addition, one of the isolated gate patterns 218a and 218b may be provided as a common gate pattern controlling two MOS transistors formed at two neighboring active patterns in the first direction.

The protruding patterns 211a, 211b and 211c included in the active pattern 210 may have a structure of a pillar having a substantially tetragonal cross-section in the Z-direction. Each of the upper regions of the three protruding patterns 211a, 211b and 211c included in the active pattern may be provided as the impurity regions of a transistor. The longitudinal direction of the active pattern 210 may be the second direction, and the three protruding patterns 211a, 211b and 211c included in the active pattern 210 may be arranged in parallel to the second direction.

The active patterns 210 may also be arranged parallel to the first direction. That is, the active patterns may be arranged in the X-direction and the Y-direction in a row without making a staggered arrangement.

The second protruding pattern 211b formed at the central position of the active pattern 210 may be used as a common impurity region for two independent transistors. Each of the first and third protruding patterns 211a and 211c formed at both edge portions of the active pattern 210 may be used as impurity regions for each of the transistors.

The first and second gate patterns 218a and 218b may have an isolated pattern shape having the second direction as a longitudinal direction.

Hereinafter, a gate pattern facing the first and second protruding patterns 211a and 211b in the active pattern may be referred to as a first gate pattern 218a, and a gate pattern facing the second and third protruding patterns 211b and 211c in the active pattern may be referred to as a second gate pattern 218b.

Referring to C portion in FIG. 6B, the first gate pattern 218a may include a first portion 217a extended in the second direction between two neighboring active patterns in the first direction, and a second portion 217b extended from the first portion to a trench portion between the first and second protruding patterns 211a and 211b. The first portion may face a first face disposed on the same plane of the first and second protruding patterns 211a and 211b included in the two active patterns.

The second gate pattern 218b may have a staggered (or inter-digitated) arrangement with the first gate pattern 208a. The second gate pattern 218b may include a first portion 217a extended in the second direction between the neighboring two active patterns, and a second portion 217b extended in the first direction from the first portion 217a to the trench portion between the second and third protruding patterns 211b and 211c.

The end portion of the second portion 217b of the first gate pattern 218a may not be extended to the end portion of the first and second protruding patterns 211a and 211b. That is, a space to the end portion between the first and second protruding patterns 211a and 211b may be formed by using an insulating material. In addition, the end portion of the second portion 217b of the second gate pattern 218b may also be formed by using an insulating material. Similarly, the second and third protruding patterns may not be extended to the end portion thereof.

The upper portions of the protruding patterns 211a, 211b and 211c disposed higher than the upper surface of the first and second gate patterns 218a and 218b may become impurity regions 110a, 110b and 110c of each of the transistors. Accordingly, the upper surface of the first and second gate patterns 218a and 218b may be disposed lower than the upper surface of the protruding patterns 211a, 211b and 211c. Since a portion of the sidewall of the connecting portion 211d covers the first and second gate patterns 218a and 218b, the lower surfaces of the first and second gate patterns 218a and 218b may be disposed lower than the upper surface of the connecting portion 211d.

The bit line 222 may be extended in the second direction. That is, the bit line may be extended in the same direction as the longitudinal direction of the active pattern 210. The bit line 222 may make an electric connection with the second protruding pattern 211b positioned at the central position of the active pattern 210 through a bit line contact 220. As illustrated in FIG. 6B, the bit line 222 may be disposed between each of the active patterns.

The word line 216 may be extended in the first direction. That is, the word line 216 may be extended in a vertical direction to the longitudinal direction of the active pattern 210.

In FIG. 6B, a first word line 216a may be connected to one sidewall of each of first gate patterns 218a disposed in parallel to the first direction.

Similarly, a second word line 216b may be connected to each of second gate patterns 218b disposed in parallel to the first direction. That is, the second word line 216b may have an extended shape while making a direct contact with the sidewall of the second gate patterns 218b.

Since each of the active patterns are arranged in a row, the first and second word lines extended to the sidewall of the first and second gate patterns, respectively, may be provided.

As described above, a MOS transistor including the first gate pattern 218a and a MOS transistor including the second gate pattern 218b may be respectively provided in the active pattern 210. The two independent MOS transistors may include U shape channels along two of the one faces disposed in parallel in each protruding pattern. The shape of the channel may be the same as explained referring to FIG. 1B.

FIGS. 7A to 7E are plan views for explaining a method of manufacturing an array structure illustrated in FIGS. 6A and 6B.

Figure 7A:
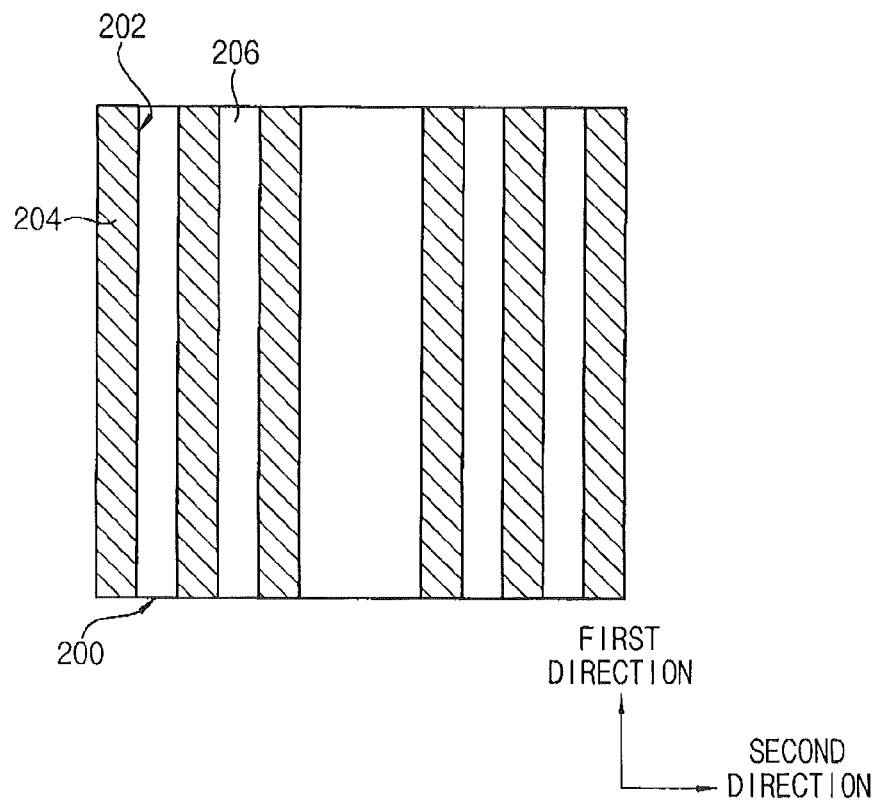
FIGS. 7A to 7E are plan views for explaining a method of manufacturing an array structure illustrated in FIGS. 6A and 6B.

Referring to FIG. 7A, a first trench 202 may be formed on a semiconductor substrate 200 by forming a hard mask extended in the first direction and then conducting a dry etching by using the hard mask as an etching mask. At both sides of the first trench 202, preliminary active patterns 204 may be formed. The semiconductor substrate may be a single crystalline silicon substrate. The first trench 202 may have a first depth.

The inner portion of the first trench 202 between the preliminary active patterns 204 may be filled up with a first insulating layer 206. The first insulating layer 206 may be formed by using silicon oxide or silicon nitride.

The preliminary active patterns 204 may be arranged in a row for each line. As illustrated in FIG. 7A, between the three lines of the preliminary active patterns 204, a relatively wide interval may be set for forming a word line.

Figure 7B:
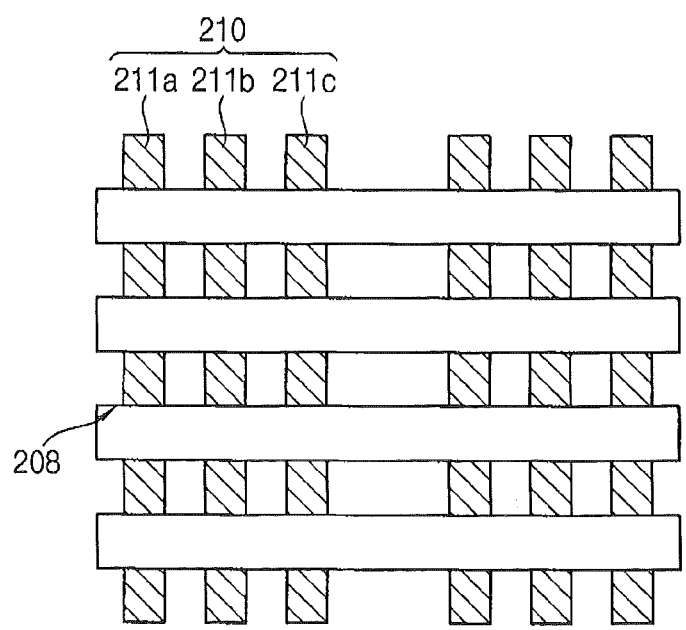

Referring to FIG. 7B, a portion of the preliminary active pattern 204 and the first insulating layer 206 may be etched to form a second trench 208 extended in the second direction perpendicular to the first direction. The second trench 208 may be formed to a second depth smaller than the first depth. Through forming the second trench 208, the protruding patterns 211a, 211b and 211c may be formed. The protruding patterns 211a, 211b and 211c may be arranged in an X-direction and a Y-direction without making a staggered arrangement.

The protruding patterns 211a, 211b and 211c may be formed in parallel in a group of three to form an active pattern 210. The active patterns 210 may be arranged in the first direction without making a staggered arrangement.

Figure 7C:
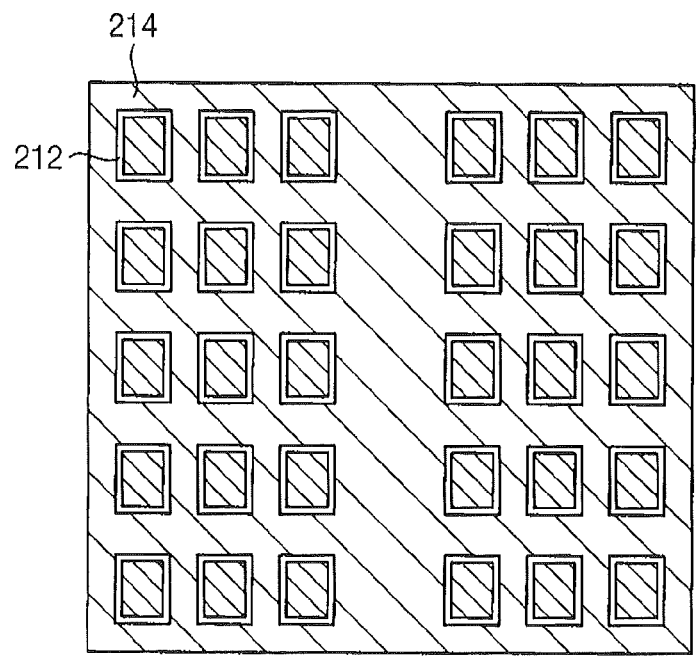

Referring to FIG. 7C, the sidewall portion of the protruding patterns 211a, 211b and 211c may be exposed by removing the first insulating layer 206 formed between the protruding patterns 211a, 211b and 211c. The removing process may be conducted by a wet etching process.

A gate insulating layer 212 may be formed along the sidewall and the bottom surface of the protruding patterns 211a, 211b and 211c. The gate insulating layer 212 may be formed so that the trench portions between the protruding patterns 211a, 211b and 211c may not be buried.

A gate conductive layer filling up the gap portion may be formed on the gate insulating layer 212. Then, the gate conductive layer may be planarized to expose the upper surface of the protruding patterns 211a, 211b and 211c. The gate conductive layer may be additionally removed so that the upper surface of the gate conductive layer may be lower than the upper surface of the protruding patterns. Through conducting the above described process, a preliminary gate pattern 214 having a cross shape may be formed.

Figure 7D:
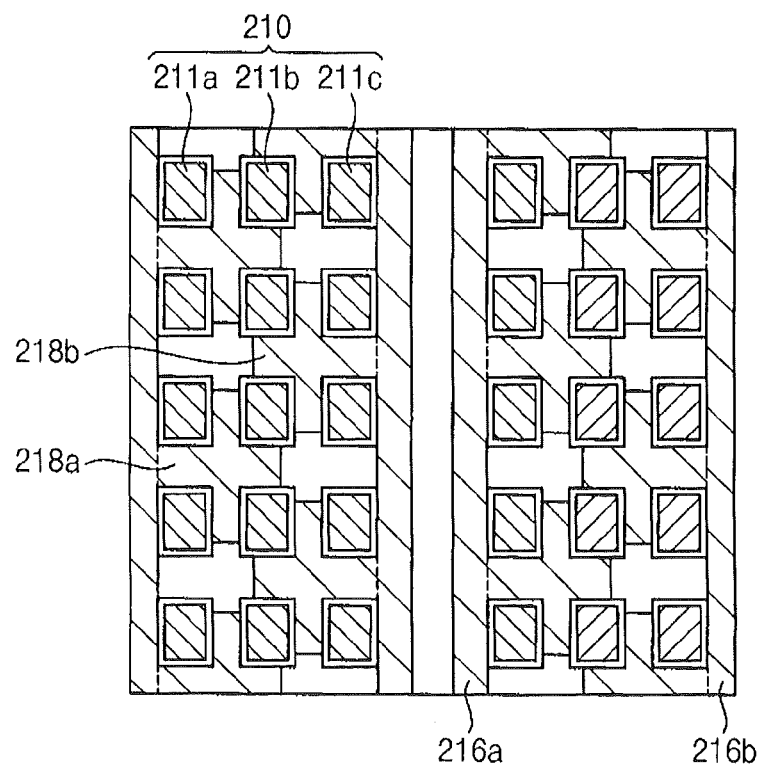

Referring to FIG. 7D, an etching mask pattern for exposing a portion of the preliminary gate pattern 214 may be formed. The etching mask pattern may have a shape for exposing a portion to be removed for separating the preliminary gate pattern 214 and forming each of independent gate patterns. In addition, the etching mask pattern may have a shape for exposing a portion for separating to form each of the word lines.

By using the etching mask pattern, the preliminary gate pattern 214 may be etched to form first and second gate patterns 218a and 218b, and first and second word lines 216a and 216b. The first word line 216a may be directly connected to the sidewall of the first gate pattern 218a, and the second word line 216b may be directly connected to the sidewall of the second gate pattern 218b.

Figure 7E:
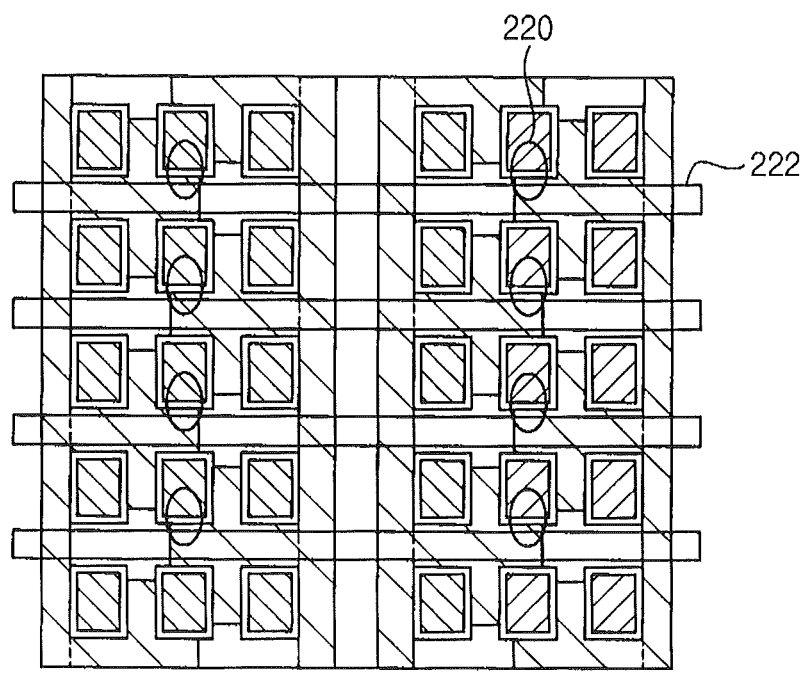

Referring to FIG. 7E, an insulating interlayer filling up the inner portion of an opening portion formed through the etching while covering the first and second gate patterns 218a and 218b, the first and second word lines 216a and 216b, and active patterns 210 may be formed.

A contact hole exposing the upper surface of the second protruding pattern 211b positioned at the central position of the active pattern 210 may be formed by etching a portion of the insulating interlayer. A bit line contact 220 may be formed in the contact hole. In addition, a bit line 222 making contact with the bit line contact 220 and extended in the second direction may be formed.

Figure 8:
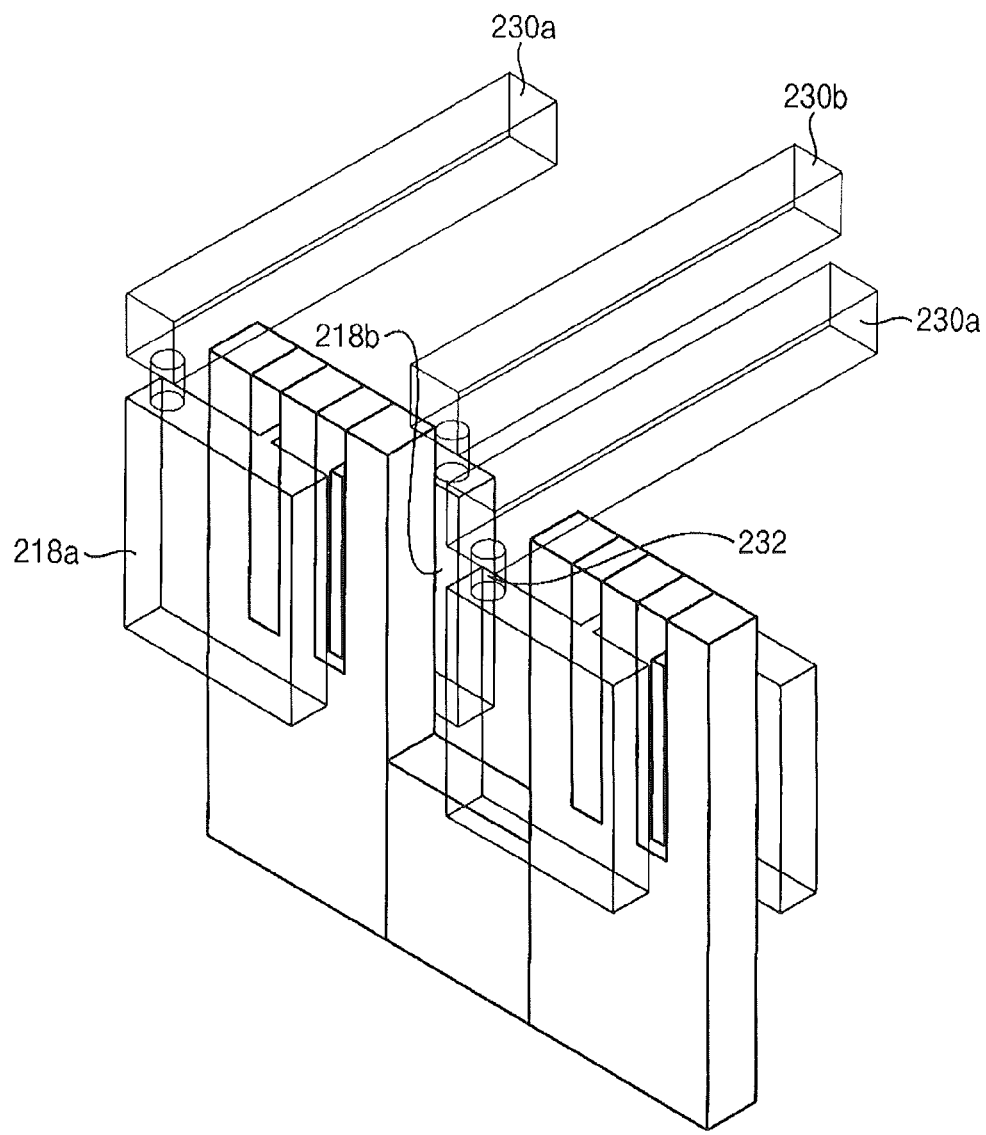
Figure 8:
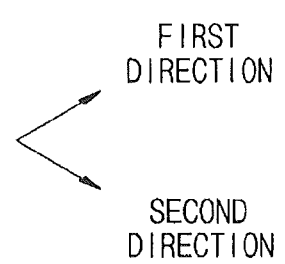

FIG. 8 is a perspective view illustrating an array structure in accordance with some embodiments according to the inventive concept.

FIG. 8 is a modified embodiment of the array structure illustrated in FIG. 6A.

The array structure illustrated in FIG. 8 may have the same structure and arrangement as the array structure of the MOS transistor illustrated in FIGS. 6A and 6B. The structure is the same as the array structure illustrated in FIGS. 6A and 6B except that first and second word lines 230a and 230b are disposed higher than the upper surface of the first and second gate patterns 218a and 218b, respectively.

Accordingly, the first gate pattern 218a and the first word line 230a may make an electric connection through a word line contact 232 connecting the first gate pattern 218a and the first word line 230a to each other. In addition, the second gate pattern 218b and the second word line 230b may make an electric connection through the word line contact 232 connecting the second gate pattern 218b and the second word line 230b to each other.

Figure 9:
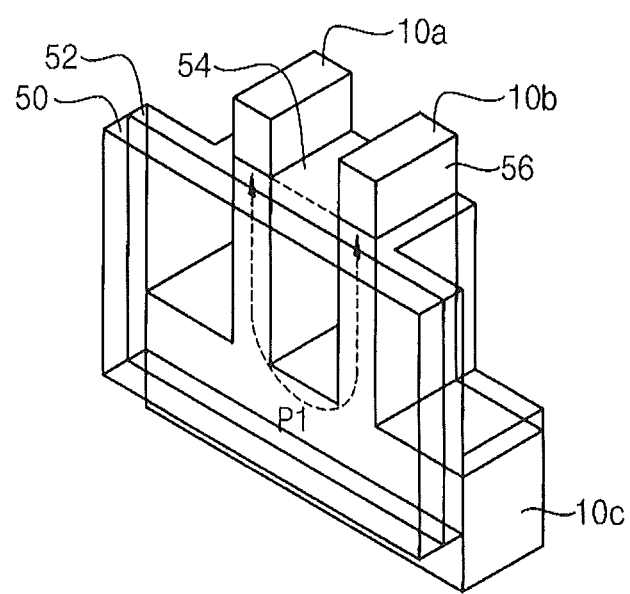

FIG. 9 is a perspective view illustrating a MOS transistor in accordance with some embodiments according to the inventive concept.

The shape of the gate pattern of a MOS transistor in accordance with the present embodiment may be different from that of the MOS transistor in accordance with the embodiment illustrated in FIG. 1.

Referring to FIG. 9, a MOS transistor in accordance with some embodiments according to the inventive concept may include an active pattern including two protruding patterns 10a and 10b (hereinafter, referred to as first and second protruding patterns) protrude in a Z-direction and a connecting portion 10c for connecting two bottom end portions of the protruding patterns 10a and 10b, an insulating pattern 54 provided in a trench between the first and second protruding patterns 10a and 10b, and an isolated gate electrode 50 disposed at one sidewall of the active pattern and the insulating pattern 54.

The insulating pattern 54 may be provided in the trench between the first and second protruding patterns 10a and 10b. Accordingly, the facing portion of the first and second protruding patterns 10a and 10b may be insulated.

The gate pattern 50 may have an isolated pattern shape and may cover one face on one straight line of the first and second protruding patterns 10a and 10b and the sidewall portion of the connecting portion 10c and the insulating pattern 54. A gate insulating layer 52 may be disposed between the active pattern and the gate pattern 50.

The gate pattern 50 may have a rectangular parallelepiped shape.

The upper region of each of the protruding patterns 10a and 10b disposed on the gate pattern 50 may be impurity regions 56 provided as source/drain regions. In addition, the MOS transistor may be formed in a U shape along the faces of the two protruding patterns 10a and 10b (arrayed in a straight line) and the sidewall of the connecting portion 10c.

Figure 10A:
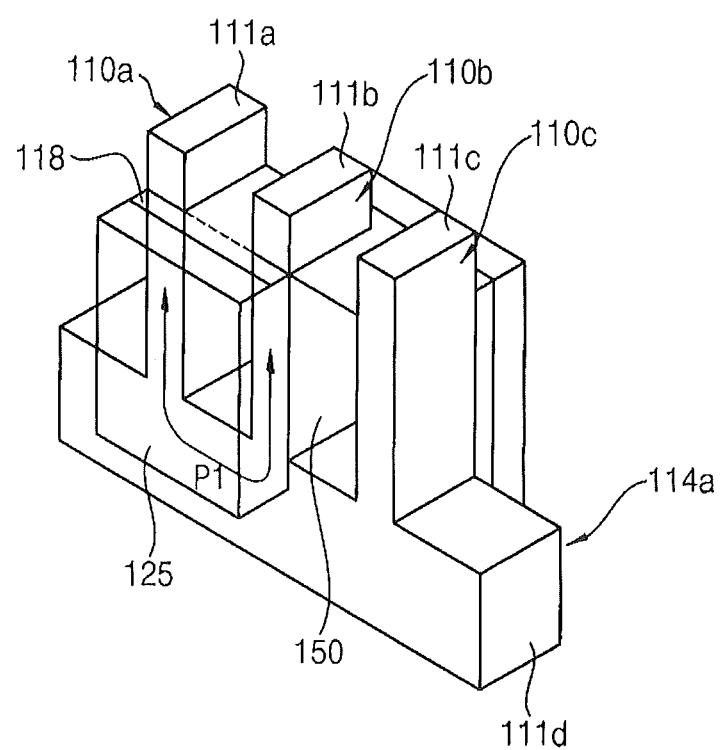
FIG. 10A is a perspective view illustrating an array structure in accordance with some embodiments of the inventive concept.

FIG. 10A is a perspective view illustrating an array structure in accordance with some embodiments according to the inventive concept. FIG. 10B is a plan view illustrating an array structure in accordance with some embodiments according to the inventive concept.

The MOS transistor included in the array structure in accordance with the present embodiment may include the MOS transistor illustrated in FIG. 9. FIG. 10A illustrates A portion in FIG. 10B.

The array structure illustrated in FIGS. 10A and 10B may have the same arrangement as the array structure illustrated in FIG. 2B. Only the shape of the MOS transistor included in each array structure may be different. Different from FIGS. 2A and 2B, the gate pattern 125 in accordance with some embodiments according to the inventive concept may include only the first portion and may exclude the second portion.

As illustrated in FIGS. 10A and 10B, two independent MOS transistors may be provided in one active pattern. Each of the two independent MOS transistors may form a U shape channel along the side surface of the protruding patterns 111a, 111b and 111c and the connecting portion, respectively. That is, each of the MOS transistors may operate to form channel as illustrated in FIG. 9.

In addition, one gate pattern 125 may be provided as a common gate of two MOS transistors formed at two different active patterns. That is, the gate pattern 125 may control two MOS transistors formed at two active patterns facing in front of and at the rear of the gate pattern 125, respectively.

A bit line 132, a bit line contact 130, a word line 128 and a word line contact 126 may be arranged as the same manner explained referring to FIGS. 2A and 2B.

The word line contact 126 making a contact with the upper surface of the gate pattern 125, and the word line making a contact with the word line contact may be provided. The word line may be extended in the second direction.

The bit line contact 130 making a contact with the upper surface of the second protruding pattern, and the bit line making a contact with the bit line contact and extended in the first direction may be provided.

FIGS. 11A to 11D are plan views for explaining a method of manufacturing an array structure illustrated in FIGS. 10A and 10B.

First, the structure illustrated in FIG. 3B may be formed by conducting the procedure explained referring to FIGS. 3A and 3B. In exemplary embodiments, a first trench may be formed to have a first inner width, and a second trench may be formed to have a second inner width smaller than the first inner width.

Then, the structure illustrated in FIG. 3D may be formed by conducting the procedure explained referring to FIGS. 3C and 3D.

Figure 11A:
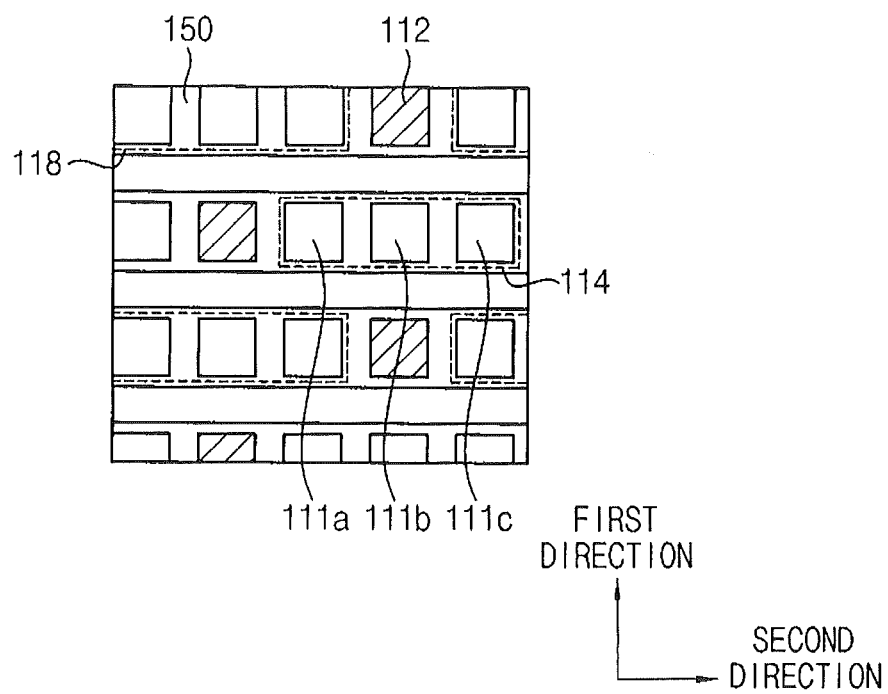
FIGS. 11A to 11D are plan views for explaining a method of manufacturing an array structure illustrated in FIGS. 10A and 10B.

Referring to FIG. 11A, a gate insulating layer 118 may be formed at the sidewall of the protruding patterns 111a to 111c. The gate insulating layer 118 may be formed by conducting a thermal oxidation process.

The gate insulating layer 118 may be formed to fill up the inner portion of the second trench 108 having a relatively narrow width while partially filling up the inner portion of the first trench 102 having a relatively wide width. Accordingly, when the gate insulating layer is formed, only the first trench 102 portion extended in the second direction may remain, The inner portion of the second trench 108 may be completely filled up with the gate insulating layer to form an insulating pattern 150.

Figure 11B:
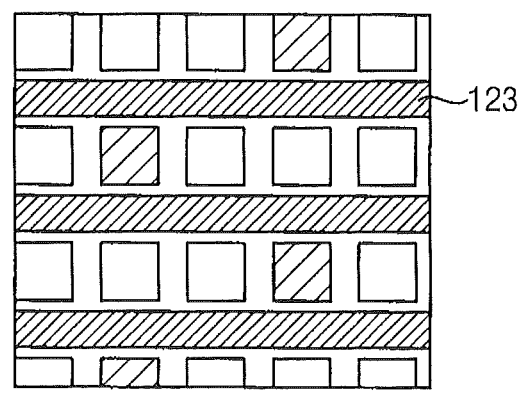

Referring to FIG. 11B, a gate electrode layer filling up the inner portion of the first trench 102 may be formed on the gate insulating layer 118. The gate electrode may be formed by using polysilicon.

The gate electrode layer may be planarized to expose the upper surface of the protruding patterns 111a to 111c. The gate electrode layer may be additionally removed so that the upper surface of the gate electrode layer may be lower than the upper surface of the protruding patterns 111a to 111c. Accordingly, a preliminary gate pattern 123 having a line shape and extended in the second direction may be formed.

Figure 11C:
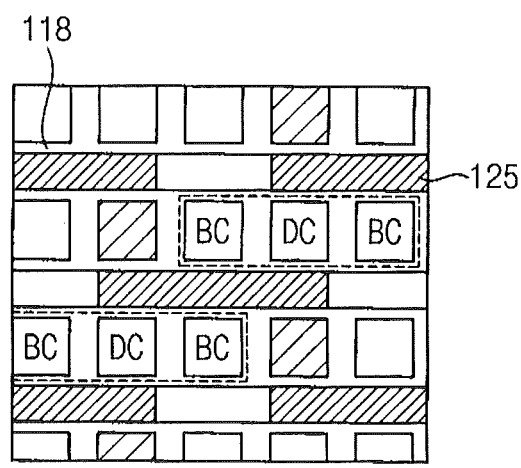

Referring to FIG. 11C, a mask pattern exposing a portion of the preliminary gate pattern 123 may be formed. The mask pattern may have a shape exposing a portion to be separated and to be removed from the preliminary gate pattern and to form independent gate patterns. Gate patterns 125 may be formed by etching a portion of the preliminary gate pattern by using the mask pattern. The gate patterns 125 may have a pillar shape having a tetragonal cross-section.

Figure 11D:
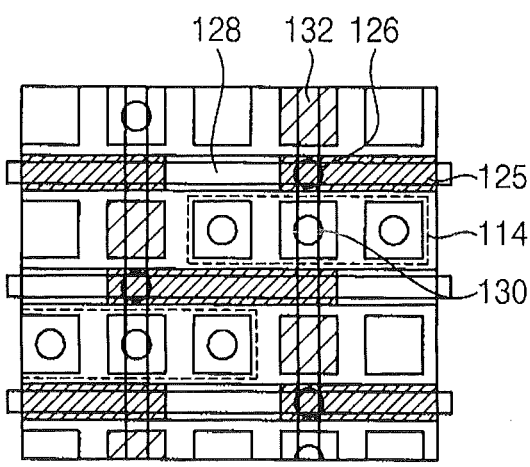

Referring to FIG. 11D, an insulating interlayer filling up a gap between the gate patterns 125 while covering the gate patterns 125 and the active patterns 114 may be formed. A contact hole exposing the upper surface of the gate patterns 125 may be formed by etching a portion of the insulating interlayer. A word line contact 126 may be formed in the contact hole. A word line 128 making a contact with the word line contact 126 and extended in the second direction may be formed. The word line 128 may be disposed between the active patterns 114. The word line 128 may include a metal material. Particularly, the word line 128 may be formed by depositing tungsten.

An insulating interlayer covering the word line 128 may be formed. A contact hole exposing the upper surface of the second protruding pattern 111b positioned at the central position of the active pattern 114 may be formed by etching a portion of the insulating interlayer. A bit line contact 130 may be formed in the contact hole. In addition, a bit line 132 making contact with the bit line contact 130 and extended in the first direction may be formed.

FIGS. 12A to 12F are plan views for explaining another method of manufacturing an array structure illustrated in FIG. 10B. FIGS. 13A and 13B are cross-sectional views taken along a line A-A' in FIGS. 12A and 12B. FIGS. 13C to 13F are cross-sectional views taken along a line B-B' in FIGS. 12C to 12F.

Figure 12A:
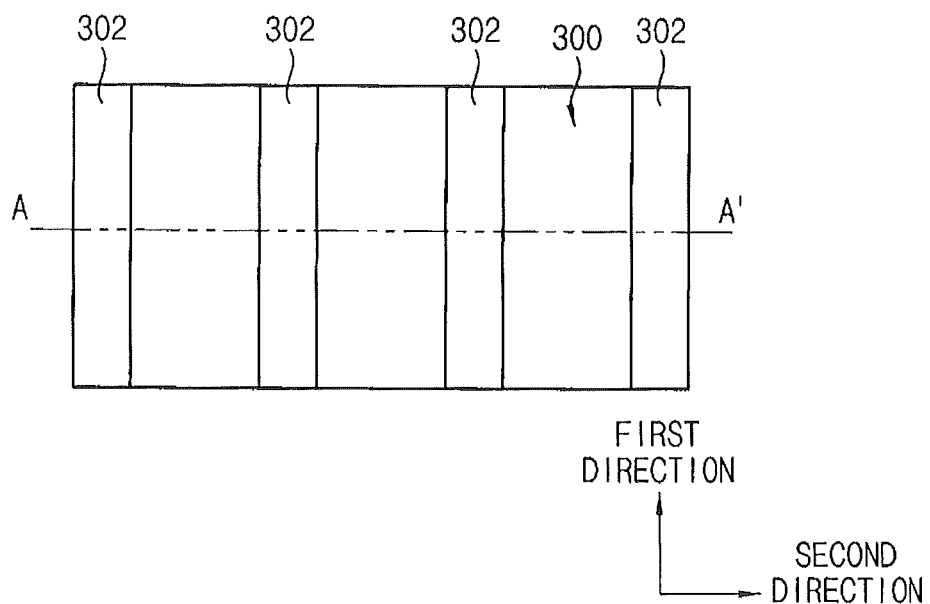
FIGS. 12A to 12F are plan views for explaining another method of manufacturing an array structure illustrated in FIG. 10B.
Figure 13A:
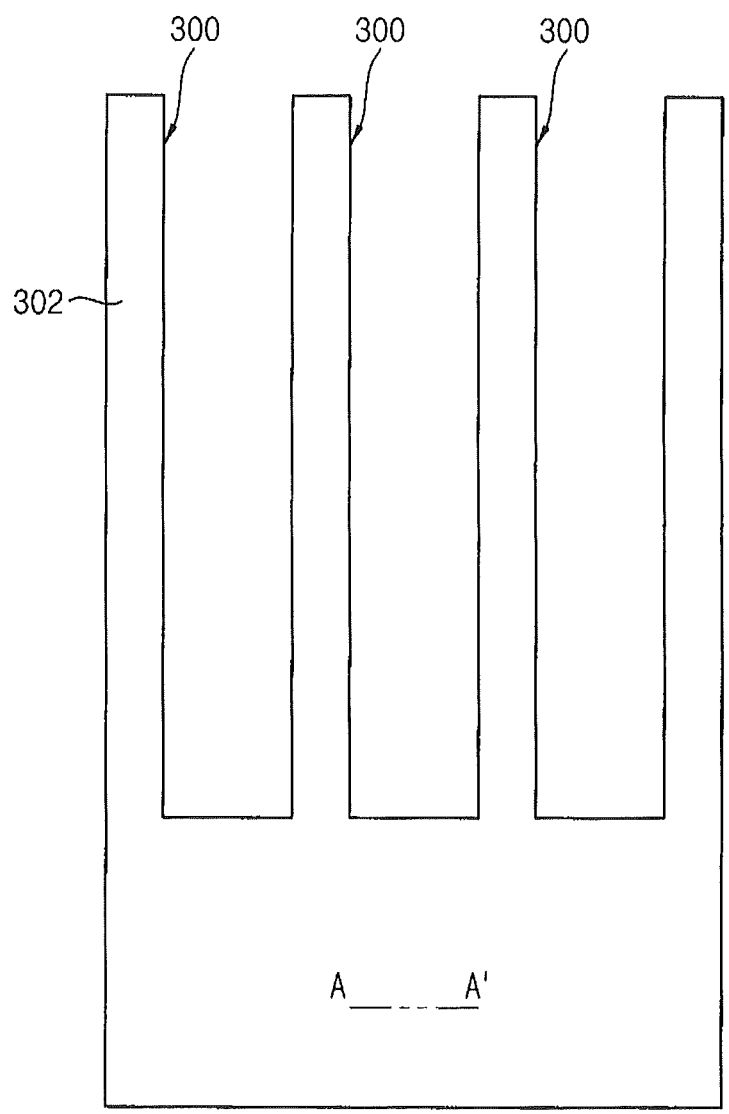
FIGS. 13A and 13B are cross-sectional views taken along a line A-A' in FIGS. 12A and 12B.
Figure 13B:
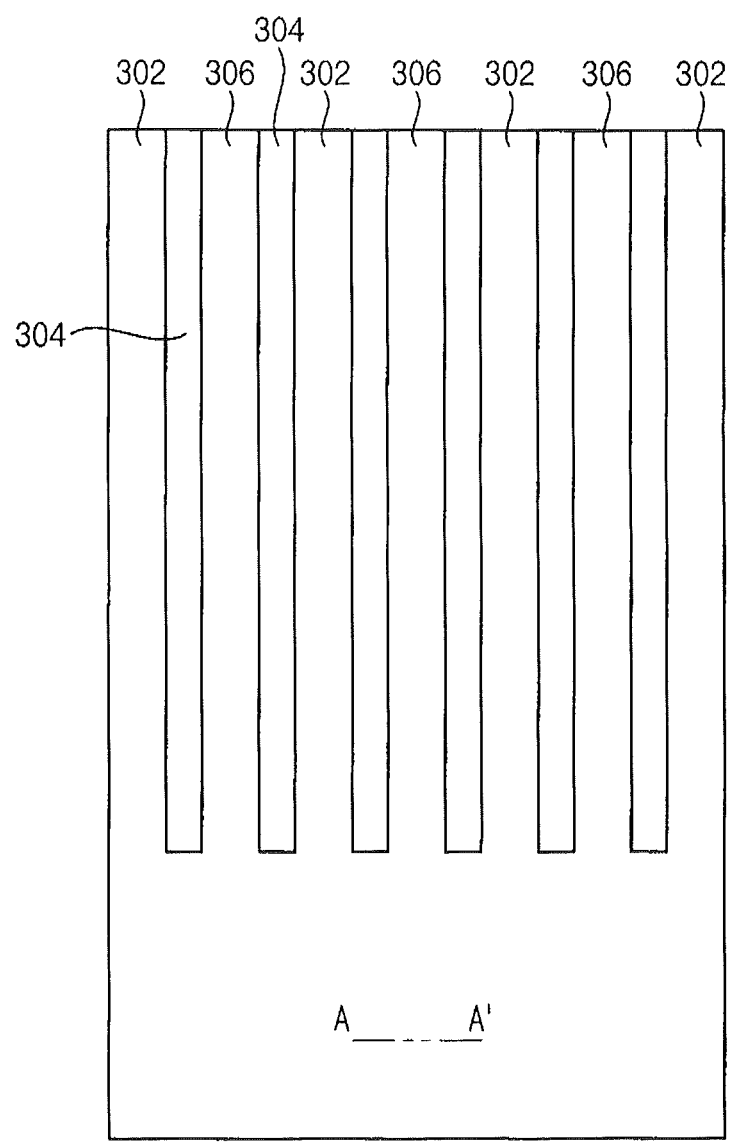

Referring to FIGS. 12A and 13A, a hard mask extended in a first direction may be formed on a semiconductor substrate, and a first trench 300 may be formed by conducting a dry etching process by using the hard mask as an etching mask. At both sides of the first trench 300, the substrate having a protrude shape may be disposed. The protrude portion may be referred to as a first semiconductor pattern 302.

The first trench 300 portion may be a portion for forming a second protruding pattern positioned at the central position of each active pattern and a gap portion between active patterns through a following process. The protrude substrate portions at both sides of the first trench 300 portion may form first and third protruding patterns through a following process.

Figure 12B:
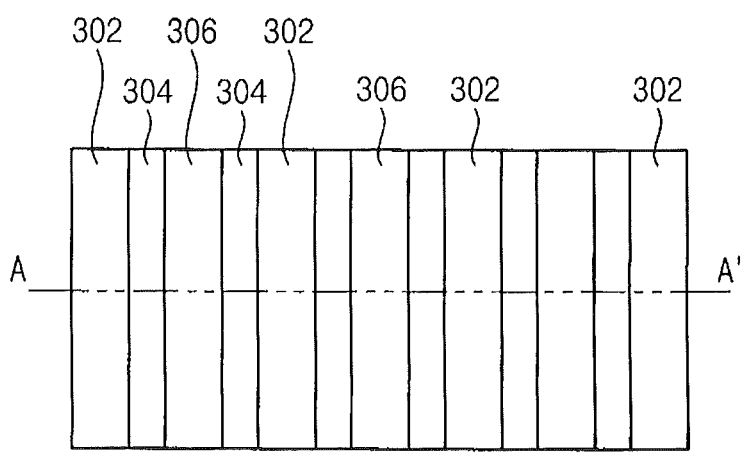

Referring to FIGS. 12B and 13B, a spacer layer may be formed by depositing an insulating material along the profile of the sidewall and the bottom surface of the first trench 300. The spacer layer may be anisotropically etched to form an insulating spacer 304 at the sidewall of the first trench. Through the bottom surface of the first trench 300, the semiconductor substrate may be exposed.

A second semiconductor pattern 306 may be formed by conducting a selective epitaxial process from the surface of the semiconductor substrate at the bottom surface of the first trench 300.

Through conducting the process, first and second semiconductor patterns 302 and 306 having a narrow distance and a line shape extended in the first direction may be formed. The first and second semiconductor patterns 302 and 306 may be insulated by the insulating spacer 304.

Figure 12C:
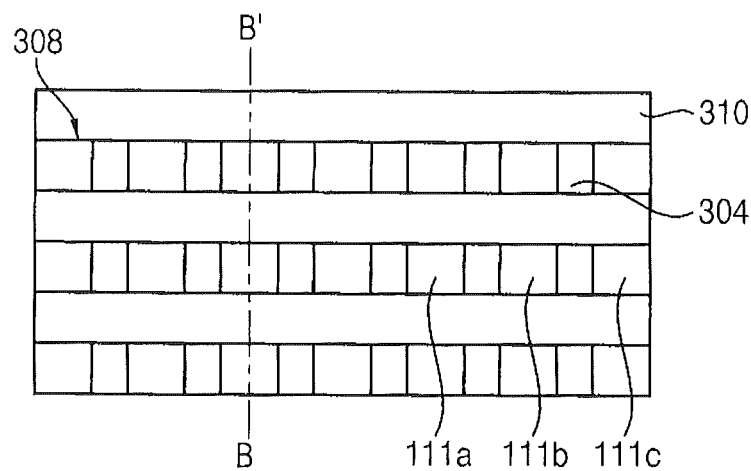
Figure 13C:
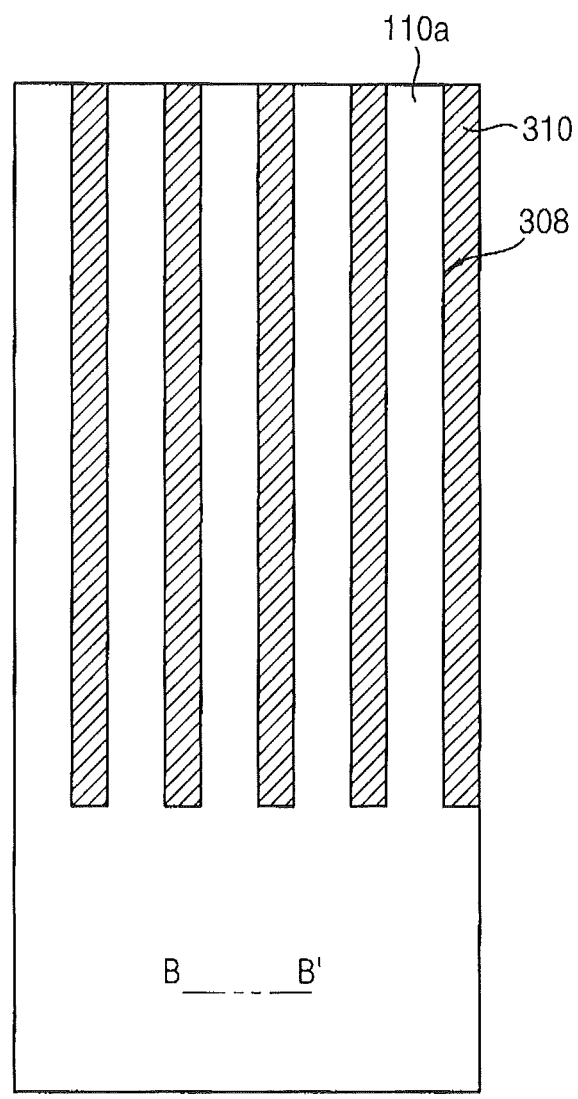
FIGS. 13C to 13F are cross-sectional views taken along a line B-B' in FIGS. 12C to 12F.

Referring to FIGS. 12C and 13C, a hard mask extended in the second direction may be formed on the first and second semiconductor patterns 302 and 306 and the spacer 304. A second trench 308 may be formed by conducting a dry etching using the hard mask as an etching mask. The second trenches 308 may be separated with a second gap greater than the first gap.

Through forming the second trench 308, protruding patterns 111a, 111b and 111c constituting the active patterns may be formed.

The second trench 308 may have a depth greater than that of the first trench 300.

The inner portion of the second trench 308 may be filled up with a first insulating layer 310. The first insulating layer 310 may be formed by using a material different from the spacer 304. The first insulating layer 310 may be formed by using a material having an etching selectivity with respect to the spacer 304.

Figure 12D:
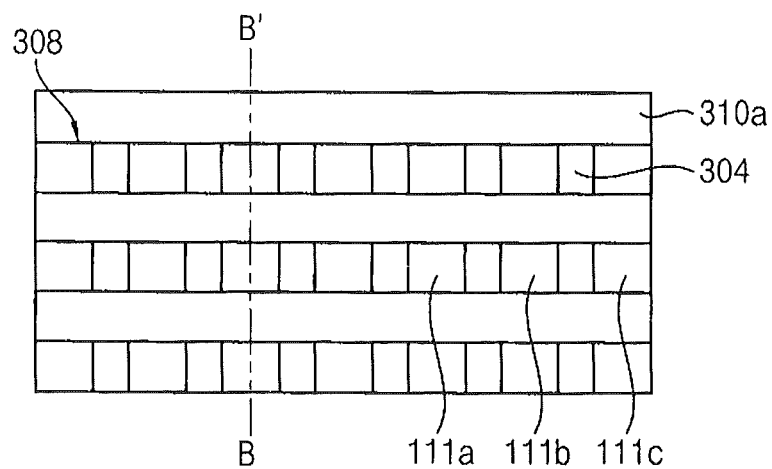
Figure 13D:
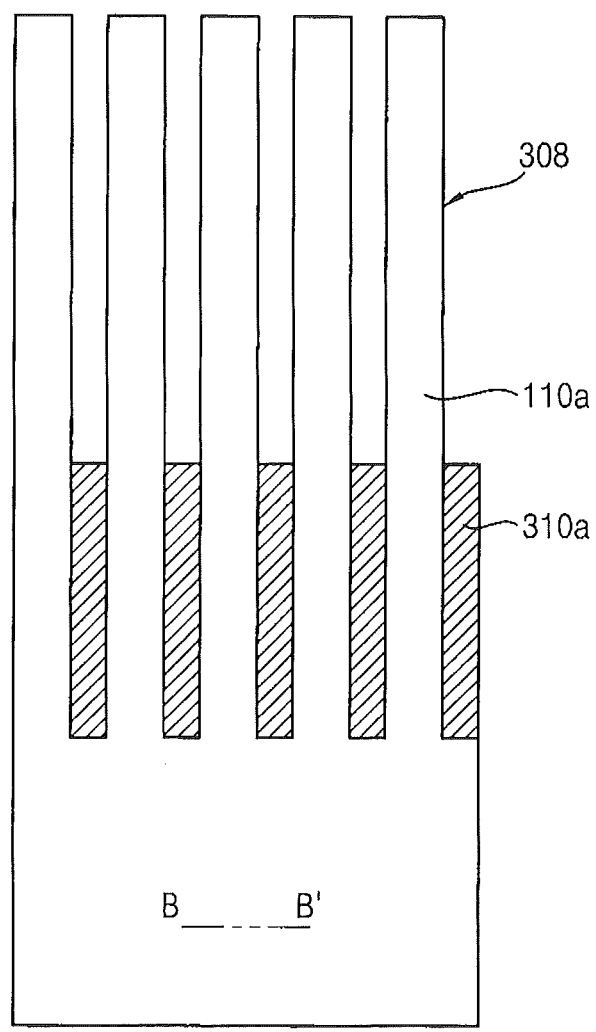

Referring to FIGS. 12D and 13D, the first insulating layer 310 may be etched back to form a first insulating layer pattern 310a filling up the lower portion of the second trench 308.

That is, a semiconductor material may be exposed through the sidewall of second trench 308, and the lower portion of the second trench 308 may be filled up with the first insulating layer pattern 310a.

Figure 12E:
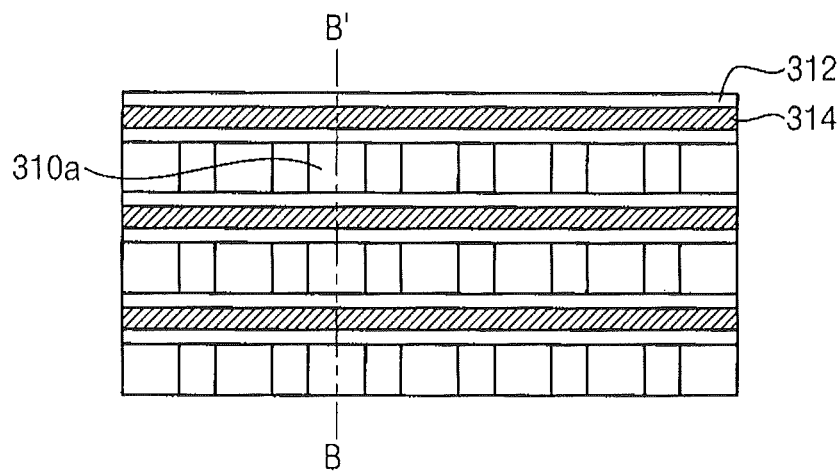
Figure 13E:
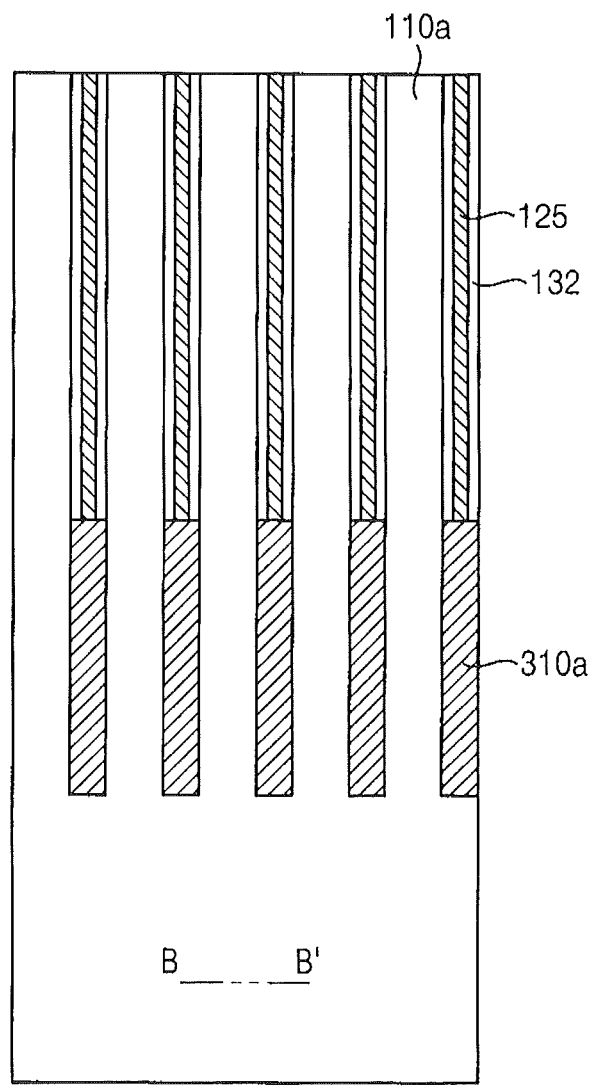

Referring to FIGS. 12E and 13E, the sidewall of the second trench 308 may be thermally oxidized to form a gate insulating layer 312. A gate electrode layer may be formed in the second trench 308 including the gate insulating layer 312 therein. The gate electrode layer may have a line shape extended in the second direction.

The gate electrode layer may be additionally removed to form a preliminary gate pattern 314 so that the upper surface of the gate electrode layer may be lower than the upper surface of the protruding patterns 111a, 111b and 111c.

Figure 12F:
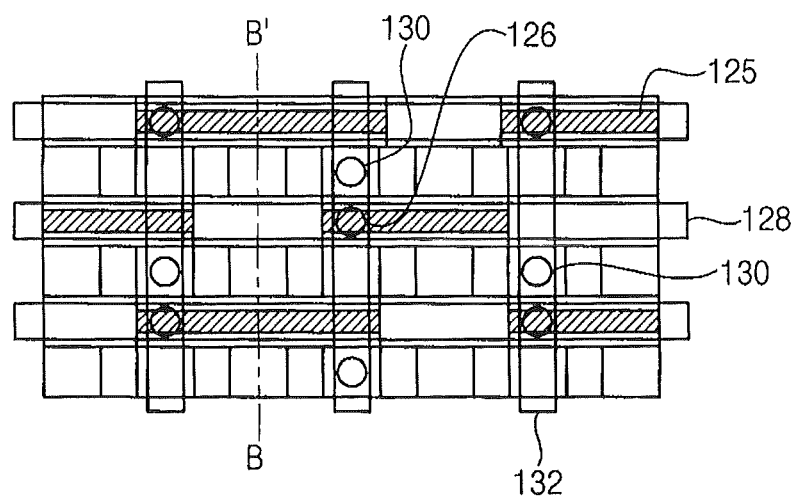
Figure 13F:
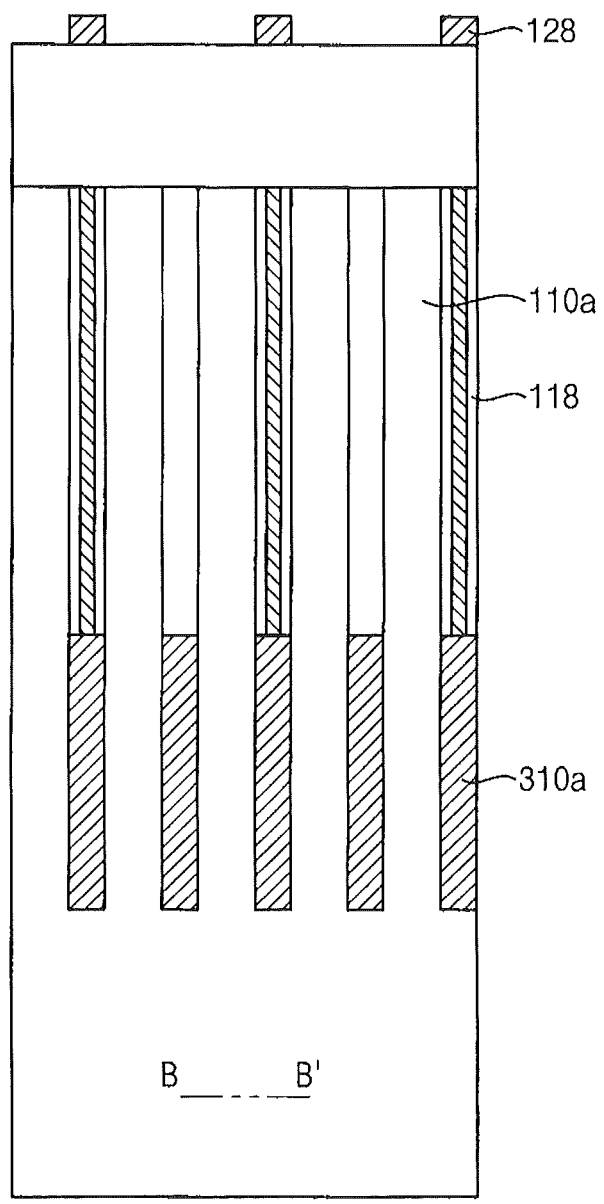

Referring to FIGS. 12F and 13F, a mask pattern exposing a portion of the preliminary gate pattern 314 may be formed. The mask pattern may have a shape of exposing a portion to be removed to separate the preliminary gate pattern 314 and to form independent gate patterns. A portion of the preliminary gate pattern may be etched by using the mask pattern to form gate patterns 125. The gate pattern 125 may have a pillar shape having a tetragonal cross-section.

Then, a word line contact 126 and a word line 128 may be formed. In addition, a bit line contact 130 and a bit line 132 may be formed. Accordingly, a transistor having an array structure illustrated in FIG. 10B may be formed.

Figure 14:
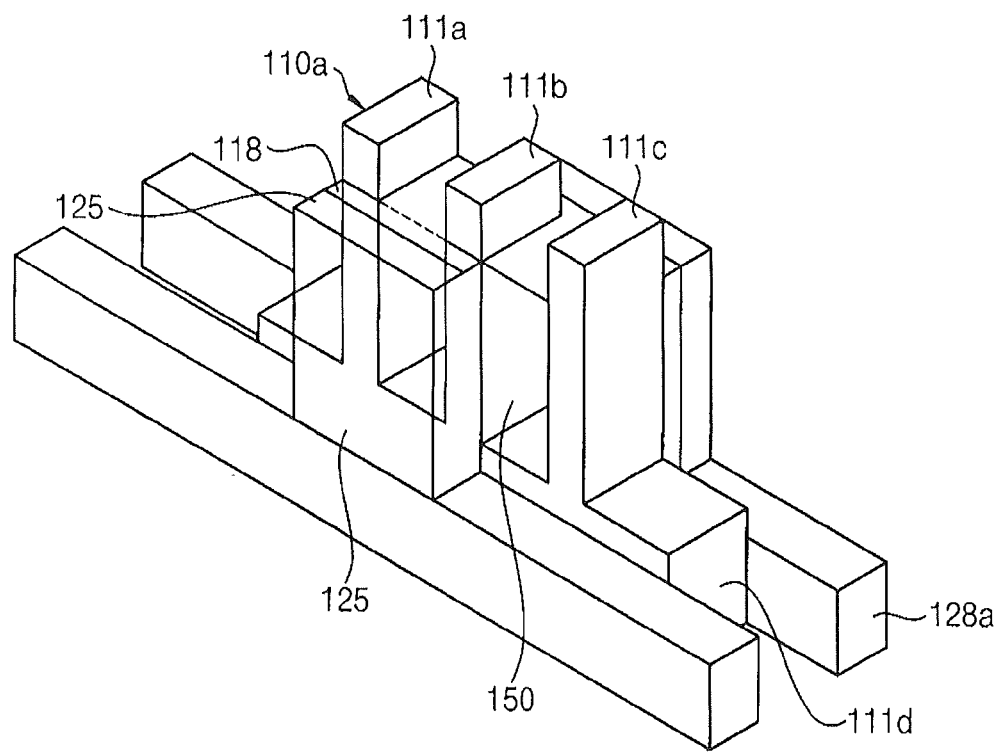

FIG. 14 is a perspective view illustrating an array structure in accordance with some embodiments according to the inventive concept.

FIG. 14 is a modified embodiment of the array structure illustrated in FIG. 10A.

The array illustrated in FIG. 14 may have the same structure as the MOS transistor illustrated in FIGS. 10A and 10B. Different from FIG. 10A, each of the first and second word lines may have a buried word line 128a structure making a contact with the bottom portion of the gate pattern 125.

Hereinafter, a method of manufacturing the array structure illustrated in FIG. 14 will be explained.

First, a structure illustrated in FIG. 3B may be formed by conducting the procedure explained referring to FIGS. 3A and 3B. In the process, the first trench may be formed to have a first inner width, and the second trench may be formed to have a second inner width smaller than the first inner width. The structure illustrated in FIG. 3C may be formed by conducting the same procedure explained referring to FIG. 3C.

The procedure explained referring to FIGS. 5A and 5B may be conducted to form a structure including a buried word line 128a at the lower portion thereof and the same upper structure as illustrated in FIG. 4C.

After that, the same procedure explained referring to FIGS. 11A to 11E may be conducted. That is, a first gate electrode and a second gate electrode may be formed. The lower surface of the first and second gate electrode may make a contact with the buried word line 128a. In addition, an insulating interlayer filling up a gap between the first and second gate patterns, while covering the first and second gate patterns and the active patterns may be formed. A portion of the insulating interlayer may be etched to form a contact hole exposing the upper surface of the second protruding pattern positioned at the central position of the active pattern. A bit line contact may be formed in the contact hole. A bit line making a contact with the bit line and extended in the first direction may be formed.

Figure 15A:
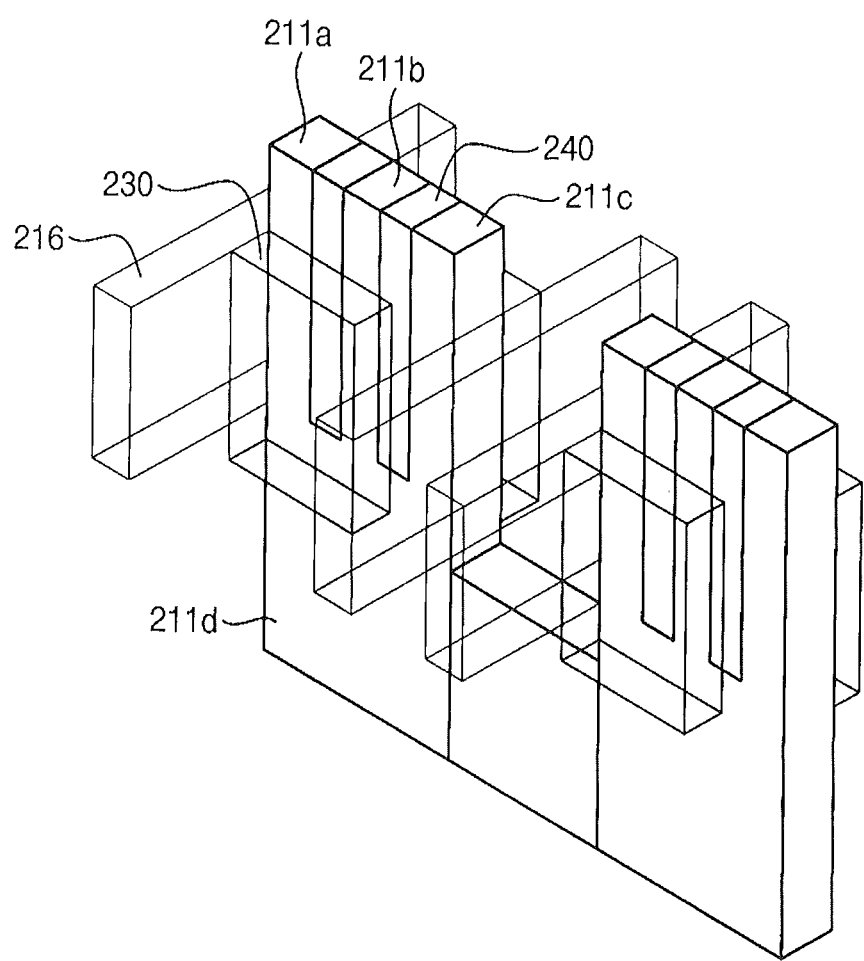
FIG. 15A is a perspective view illustrating an array structure in accordance with some embodiments of the inventive concept.
Figure 15B:
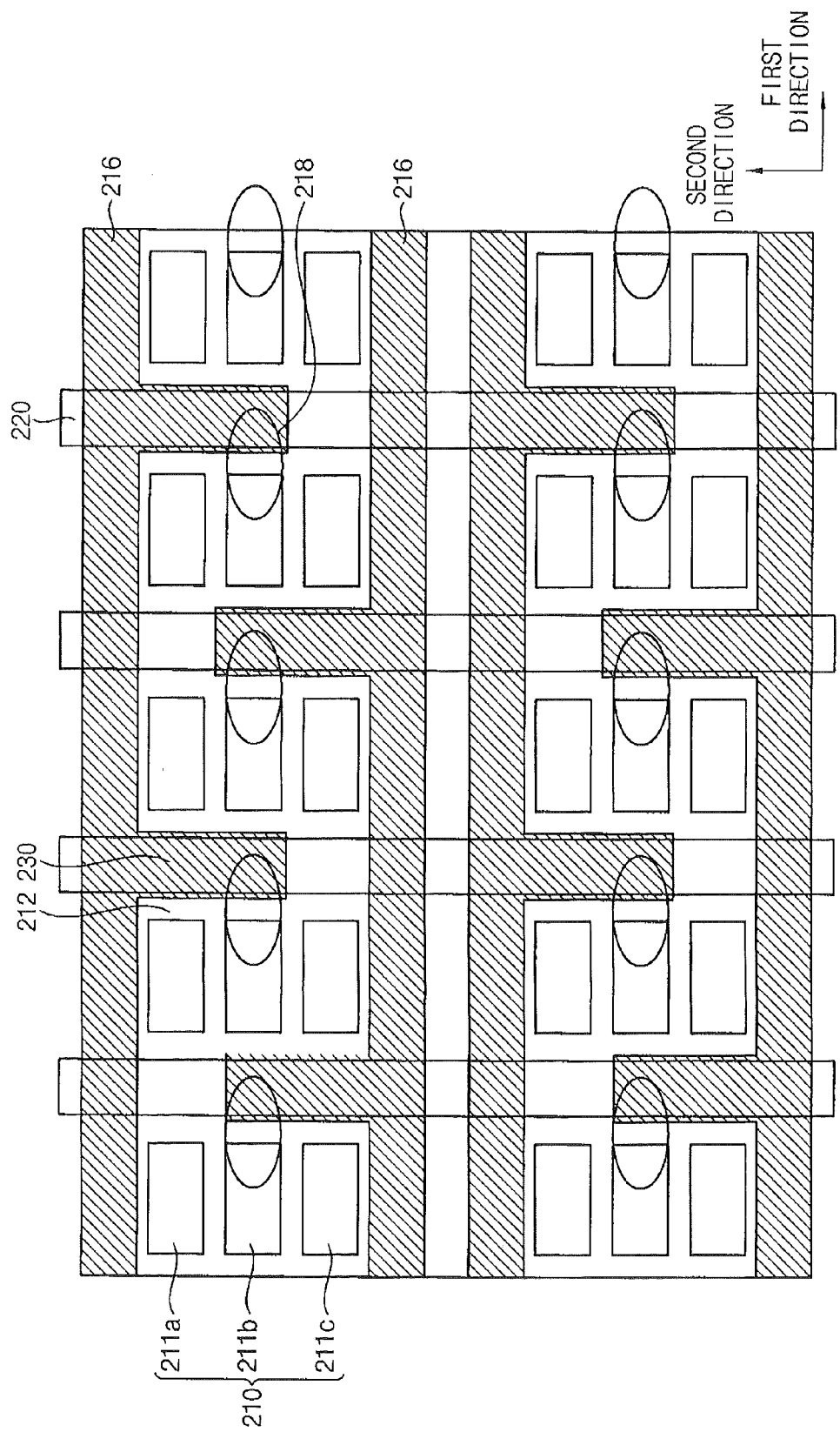
FIG. 15B is a plan view illustrating an array structure in accordance with some embodiments of the inventive concept.

FIG. 15A is a perspective view illustrating an array structure in accordance with some embodiments according to the inventive concept. FIG. 15B is a plan view illustrating an array structure in accordance with some embodiments according to the inventive concept.

The array structure in this example embodiment may include the MOS transistor illustrated in FIG. 10A.

The array structure illustrated in FIGS. 15A and 15B may have the same arrangement as the array structure illustrated in FIG. 6B. However, since the MOS transistor included in each of the array structure may be the MOS transistor illustrated in FIG. 10A, the shape of the gate electrode 230 may be different from the structure illustrated in FIG. 6B.

The gate electrode 230 may be provided with the first portion in FIG. 6B, and may not be provided with the second portion. In addition, an insulating pattern 240 may be provided between the protruding patterns included in the active pattern.

Thus, the MOS transistor included in the array structure may include a U shape channel as illustrated in FIG. 14.

Figure 16A:
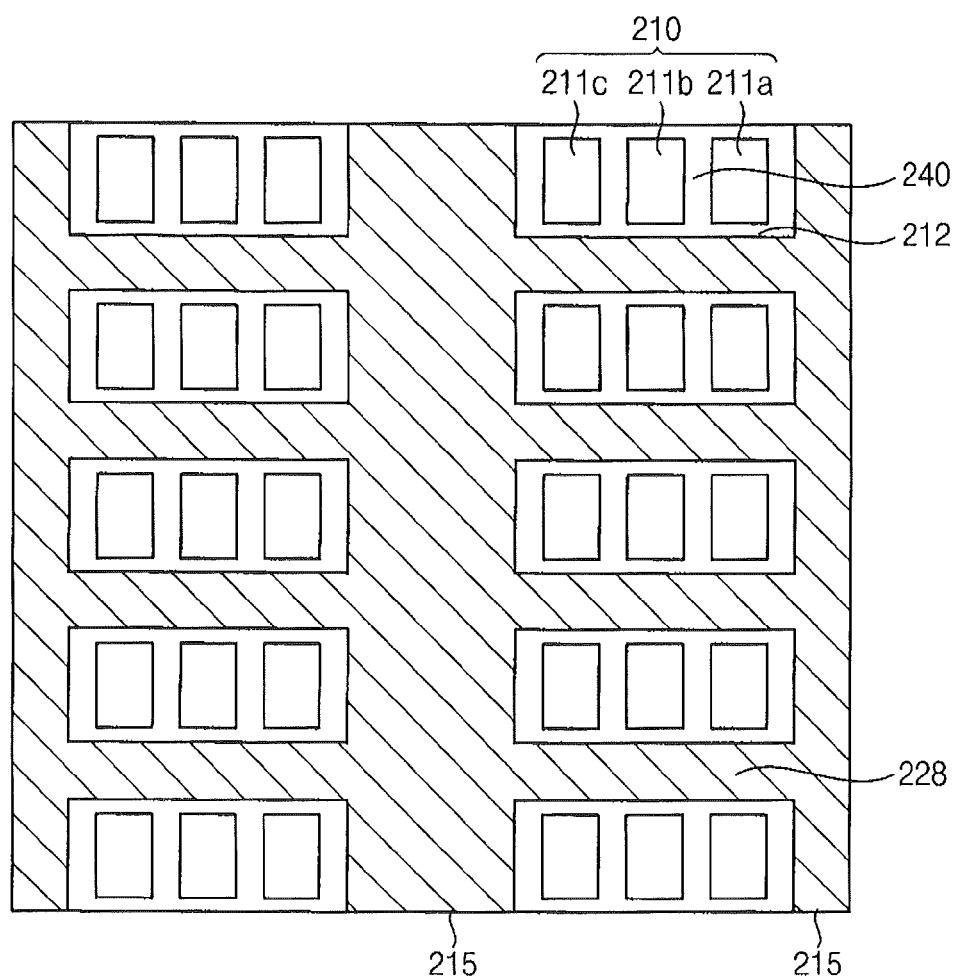
Figure 16B:
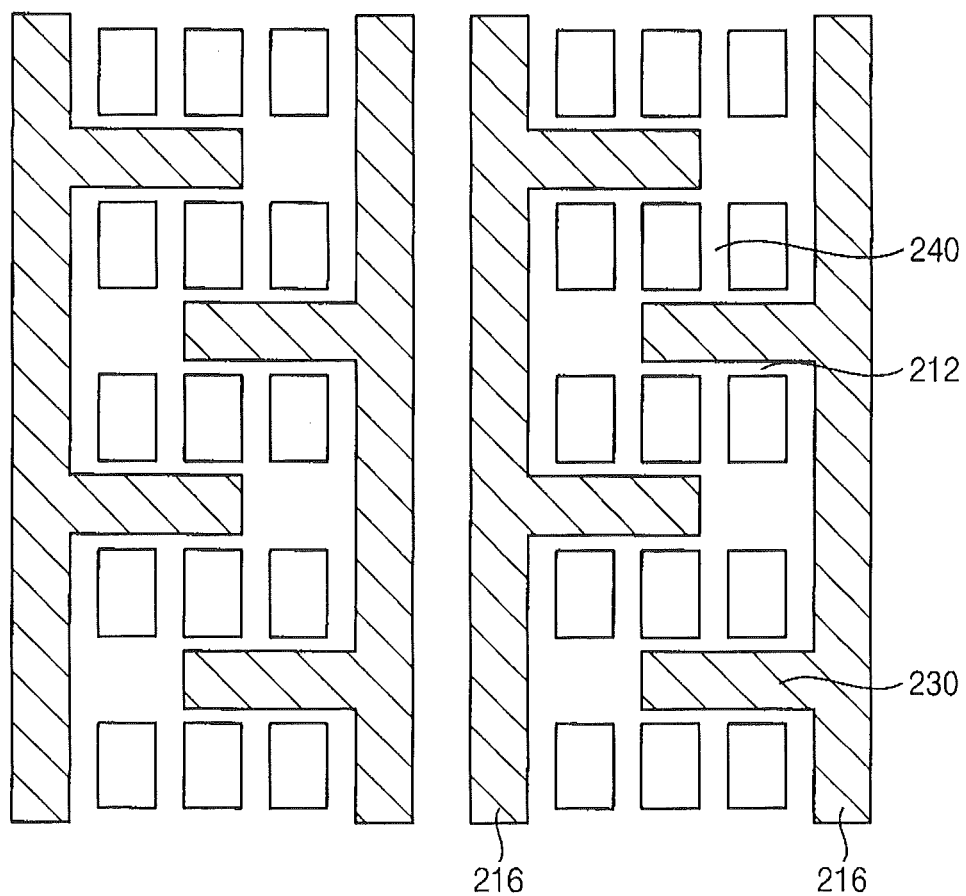

FIGS. 16A and 16B are plan views for explaining a method of manufacturing the array structure illustrated in FIGS. 15A and 15B.

By conducting the procedure explained referring to FIGS. 7A and 7B, protruding patterns arranged in a row in an X-direction and a Y-direction may be formed.

Referring to FIG. 16A, the whole of the first insulating layer formed between the protruding patterns 211a, 211b and 211c may be removed to expose the sidewall portion of the protruding patterns 211a, 211b and 211c. The removing process may be conducted through a wet etching process.

A gate insulating layer 212 may be formed along the sidewall and the bottom surface of the protruding patterns 211a, 211b and 211c. The gate insulating layer 212 may partially fill up a portion of the second trench extended in the second direction. The gate insulating layer 212 may fill up a trench portion between the protruding patterns included in the active pattern. An insulating pattern 240 may be formed by filling up the trench portion between the protruding patterns with the gate insulating layer.

On the gate insulating layer 212, a gate electrode layer filling up the second trench portion and the inner portion for forming a word line may be formed.

The gate electrode layer may be planarized to expose the upper surface of the protruding pattern. Then, the gate electrode layer may be additionally removed so that the upper surface of the gate electrode layer may be lower than the upper surface of the protruding pattern. Accordingly, a preliminary gate pattern 228 and a preliminary word line 215 may be formed.

Referring to FIG. 16B, a mask pattern for exposing a portion of the preliminary gate pattern 228 may be formed. The mask pattern may have a shape exposing a portion to be removed to separate the preliminary gate pattern 228 and to form independent gate patterns. In addition, the mask pattern may have a shape exposing the preliminary word line 215 portion to be separated for forming each of word lines.

The preliminary gate pattern 228 and the preliminary word line 215 may be etched by using the mask pattern to form gate patterns 230 and word lines 216. The gate pattern 230 and the word line 216 may be connected to each other.

As illustrated in FIG. 16B, an insulating interlayer filling up the inner portion of an opening portion formed by the etching, while covering the gate patterns, the word lines and the active patterns may be formed.

A portion of the insulating interlayer may be etched to form a contact hole exposing the upper surface of the second protruding pattern positioned at the central position of the active pattern. A bit line contact 220 may be formed in the contact hole. In addition, a bit line 222 making contact with the bit line contact 220 and extended in the second direction may be formed.

As described above, a gate electrode may be provided at the sidewall of a protruding pattern formed by using a semiconductor material, and a MOS transistor including a U shape channel may be formed. The MOS transistor may be formed at a small horizontal area but may decrease a short channel effect and a leakage current. Thus, the MOS transistor may be applied in diverse semiconductor devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A MOS transistor, comprising:
   an active pattern including a plurality of protruding patterns including a semiconductor material and arranged in parallel, and a connecting portion for forming a trench portion between the protruding patterns and connecting bottom portions of the protruding patterns with each other;
   a gate insulating layer provided on a surface of the active pattern;
   a gate pattern provided on the gate insulating layer and disposed to cover a first face on a plane of neighboring two protruding patterns and a first sidewall of the connecting portion connected to the first face, an upper surface of the gate pattern being lower than an upper surface of the protruding patterns, a bottom surface of the gate pattern being lower than a bottom surface of the trench portion between the protruding patterns; and
   impurity regions provided at portions of the protruding patterns disposed higher than the gate pattern, the MOS transistor further comprising:
   an additional gate pattern to provide an additional MOS transistor, the additional gate pattern being provided on the gate insulating layer and disposed to cover a second face on another plane of the neighboring two protruding patterns and a second sidewall of the connecting portion connected to the second face, an upper surface of the additional gate pattern being lower than the upper surface of the protruding patterns, a bottom surface of the additional gate pattern being lower than the bottom surface of the trench portion between the protruding patterns, wherein three protruding patterns arranged in parallel are included in one active pattern, and the gate pattern and the additional gate pattern use a central one of the three protruding patterns as a common active region.

2. The MOS transistor of claim 1, wherein a channel region having a U shape is provided along the first face of the neighboring two protruding patterns covered with the gate pattern and the first sidewall of the connecting portion.

3. The MOS transistor of claim 1, wherein an insulating material is buried in a trench between the protruding patterns in the active pattern.

4. The MOS transistor of claim 1, wherein the gate pattern includes a first portion covering the first face of the two neighboring protruding patterns and the first sidewall of the connection portion, and a second portion making contact with the first portion and protruding into the trench portion between the two neighboring protruding patterns.

5. The MOS transistor of claim 4, wherein a first channel region having a U shape is provided along the first face of the neighboring two protruding patterns and the first sidewall of the connecting portion, and a second channel region having a U shape is provided along a second face of the neighboring two protruding patterns facing each other at both sides of the trench portion and an upper surface of the connecting portion making contact with the second face.

6. The MOS transistor of claim 1, wherein the gate pattern has an isolated pattern shape.

7. The MOS transistor of claim 1, further comprising a word line making contact with the upper surface of the gate pattern and extended in a longitudinal direction of the active pattern.

8. The MOS transistor of claim 1, further comprising a buried word line making contact with the bottom surface of the gate pattern and extended in a same direction as an extended direction of the connecting portion.

9. The MOS transistor of claim 1, wherein at least one pattern among the two protruding patterns covering the additional gate pattern is different from the protruding pattern among the two protruding patterns covering the gate pattern.

10. The MOS transistor of claim 1, wherein the impurity region provided at the central one of the three protruding patterns is provided as a common impurity region of two MOS transistors.

11. The MOS transistor of claim 10, further comprising a bit line making contact with the protruding pattern provided as the common impurity region.

12. The MOS transistor of claim 1, wherein the active pattern is provided on a bulk silicon substrate.

13. The MOS transistor of claim 1, wherein a plurality of MOS transistors has an array structure including repeatedly formed unit transistors, each of the unit transistors including the active pattern, the gate insulating layer, the gate pattern and the impurity regions.

14. A MOS transistor, comprising:
   a u-shaped cross-sectional channel region including spaced apart protruding portions separated by a trench and connected to one another by a connecting portion of the channel region at lower ends of the spaced apart protruding portions of the channel region;
   first and second impurity regions located at opposite ends of the u-shaped cross-sectional channel region and separated from one another by the trench; and
   a gate electrode covering at least a planar face of the u-shaped cross-sectional channel region including the spaced apart protruding portions and the connecting portion and exposing the first and second impurity regions;
   the gate electrode further comprises:

a protruding portion of the gate electrode extending beyond the planar face of the u-shaped cross-sectional channel region into the trench between the spaced apart protruding portions, wherein the protruding portion extends beyond the planar face of the u-shaped cross-sectional channel region into the trench for a distance that is less than a width of the u-shaped cross-sectional channel region.

15. The transistor of claim 14 wherein the spaced apart protruding portions and the connecting portion of the channel region define a length of the u-shaped cross-sectional channel region.

16. A DRAM including a common impurity region DRAM cell structure, comprising:
   a first u-shaped cross-sectional channel region including first and second spaced apart protruding portions separated by a first trench and connected to one another by a first connecting portion of the first u-shaped cross-sectional channel region at lower ends of the first and second spaced apart protruding portions;
   a second u-shaped cross-sectional channel region including the second and a third spaced apart protruding portion separated by a second trench and connected to one another by a second connecting portion of the second u-shaped cross-sectional channel region at lower ends of the second and third spaced apart protruding portions;
   a first gate electrode covering at least a first planar face of the first u-shaped cross-sectional channel region including the first and second spaced apart protruding portions and the first connecting portion and exposing first and second impurity regions; and
   a second gate electrode covering at least a second planar face of the second u-shaped cross-sectional channel region, at an opposite end of a width of the first u-shaped cross-sectional channel region, including the second and third spaced apart protruding portions and the second connecting portion and exposing a third and the second impurity regions.

17. The DRAM of claim 16 wherein the first and second gate electrodes are arranged inter-digitated with one another.

* * * * *